United States Patent
Nidhi et al.

(10) Patent No.: US 11,527,532 B2
(45) Date of Patent: Dec. 13, 2022

(54) ENHANCEMENT-DEPLETION CASCODE ARRANGEMENTS FOR ENHANCEMENT MODE III-N TRANSISTORS

(71) Applicant: Intel Corporation, Santa Clara, CA (US)

(72) Inventors: Nidhi Nidhi, Hillsboro, OR (US); Han Wui Then, Portland, OR (US); Marko Radosavljevic, Portland, OR (US); Sansaptak Dasgupta, Hillsboro, OR (US); Paul B. Fischer, Portland, OR (US); Rahul Ramaswamy, Portland, OR (US); Walid M. Hafez, Portland, OR (US); Johann Christian Rode, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 690 days.

(21) Appl. No.: 16/419,240

(22) Filed: May 22, 2019

(65) Prior Publication Data

US 2020/0373297 A1    Nov. 26, 2020

(51) Int. Cl.
| | |
|---|---|
| *H01L 29/66* | (2006.01) |
| *H01L 27/088* | (2006.01) |
| *H01L 29/20* | (2006.01) |
| *H01L 29/205* | (2006.01) |
| *H01L 29/40* | (2006.01) |
| *H01L 23/31* | (2006.01) |
| *H01L 23/00* | (2006.01) |
| *H01L 29/778* | (2006.01) |
| *H01L 25/065* | (2006.01) |

(52) U.S. Cl.
CPC ...... *H01L 27/0883* (2013.01); *H01L 23/3128* (2013.01); *H01L 24/09* (2013.01); *H01L 24/17* (2013.01); *H01L 25/0655* (2013.01); *H01L 29/2003* (2013.01); *H01L 29/205* (2013.01); *H01L 29/402* (2013.01); *H01L 29/7786* (2013.01); *H01L 2224/0401* (2013.01)

(58) Field of Classification Search
CPC ............. H01L 27/0883; H01L 23/3128; H01L 25/0655; H01L 29/2003; H01L 29/206; H01L 29/402
USPC ........................................................ 257/104
See application file for complete search history.

(56) References Cited

U.S. PATENT DOCUMENTS

| | | | |
|---|---|---|---|
| 2009/0065810 A1* | 3/2009 | Honea | H01L 27/0605 257/192 |
| 2020/0328296 A1* | 10/2020 | Hwang | H01L 27/0883 |

* cited by examiner

*Primary Examiner* — Phuc T Dang
(74) *Attorney, Agent, or Firm* — Akona IP PC

(57) ABSTRACT

Disclosed herein are IC structures, packages, and devices that include III-N transistor-based cascode arrangements that may simultaneously realize enhancement mode transistor operation and high voltage capability. In one aspect, an IC structure includes a source region, a drain region, an enhancement mode III-N transistor, and a depletion mode III-N transistor, where each of the transistors includes a first and a second source or drain (S/D) terminals. The transistors are arranged in a cascode arrangement in that the first S/D terminal of the enhancement mode III-N transistor is coupled to the source region, the second S/D terminal of the enhancement mode III-N transistor is coupled to the first S/D terminal of the depletion mode III-N transistor, and the second S/D terminal of the depletion mode III-N transistor is coupled to the drain region.

20 Claims, 13 Drawing Sheets

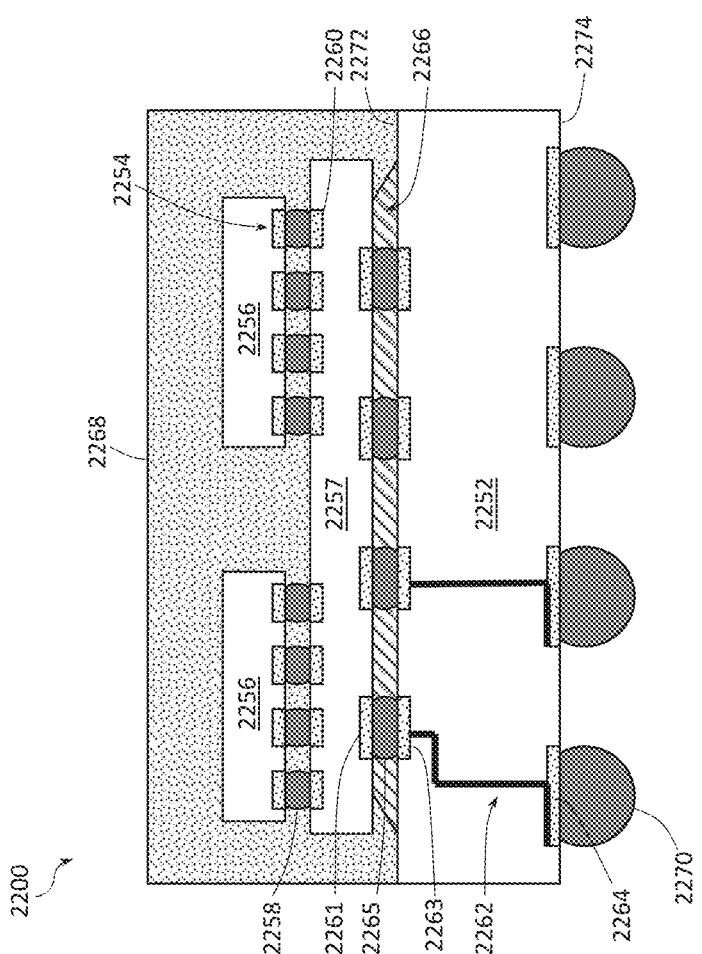

US 11,527,532 B2

ENHANCEMENT-DEPLETION CASCODE ARRANGEMENTS FOR ENHANCEMENT MODE III-N TRANSISTORS

BACKGROUND

Solid-state devices that can be used in high-frequency and/or high voltage applications are of great importance in modern semiconductor technologies. For example, radio frequency (RF) integrated circuits (ICs) (RFICs) and power management integrated circuits (PMICs) may be critical functional blocks in system on a chip (SoC) implementations. Such SoC implementations may be found in mobile computing platforms such as smartphones, tablets, laptops, netbooks, and the like. In such implementations, the RFICs and PMICs are important factors for power efficiency and form factor, and can be equally or even more important than logic and memory circuits.

Due, in part, to their large band gap and high mobility, III-N material based transistors, such as gallium nitride (GaN) based transistors, may be particularly advantageous for high-frequency and high voltage applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 is a cross-sectional side view of an IC package that may include one or more IC structures having at least one cascode arrangement in accordance with one or more embodiments.

DETAILED DESCRIPTION

Overview

Figure 1A:
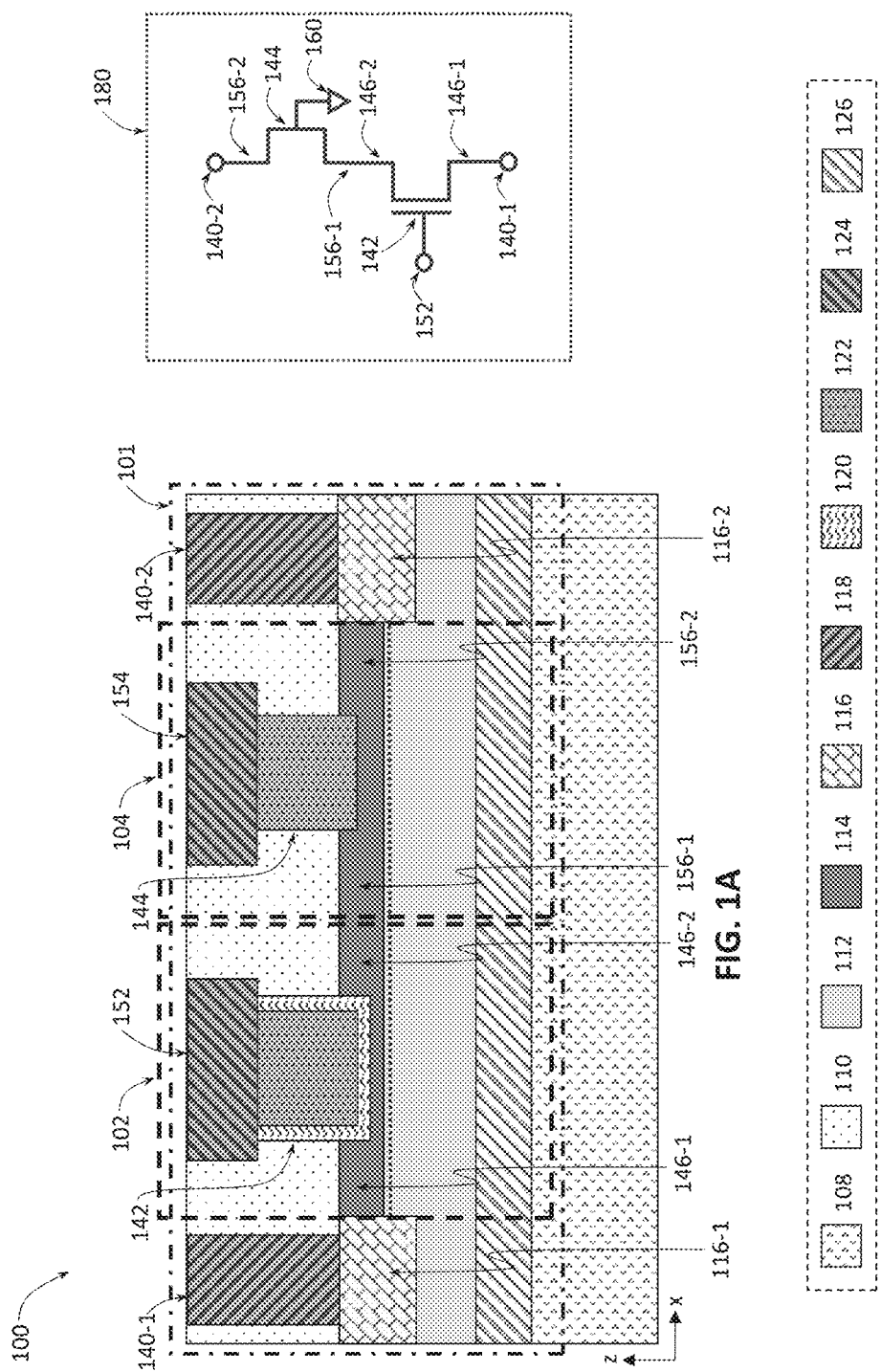
FIGS. 1A-1E provide cross-sectional side views illustrating different embodiments of an IC structure that includes a cascode arrangement with one enhancement mode III-N transistor and one depletion mode III-N transistor, according to some embodiments.

As mentioned above, transistors based on III-N semiconductor materials (i.e., III-N transistors) have properties that make them particularly advantageous for certain applications. For example, because GaN has a larger band gap (about 3.4 electron-volts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, III-N transistors may advantageously employ a 2D electron gas (2DEG) (e.g., a group of electrons, an electron gas, free to move in two dimensions but tightly confined in the third dimension, e.g., a 2D sheet charge) as its transport channel, enabling high mobility without relying on using impurity dopants. For example, the 2DEG may be formed in a portion of a III-N semiconductor material that is near a heterojunction interface formed between the III-N semiconductor material and a charge-inducing film of a material having larger spontaneous and piezoelectric polarization, compared to the III-N semiconductor material. Such a film is generally referred to as a "polarization material" while the III-N semiconductor material adjacent to the polarization material may be referred to as a "III-N channel material" because this is where a conductive channel (2DEG) may be formed during operation of the III-N transistor. Together, a stack of a III-N channel material and a polarization material may be referred to as a "III-N channel stack" of a III-N transistor. A material that has a lattice constant smaller than that of a given III-N channel material may serve as a polarization material that may cause formation of 2DEG in the III-N channel material. Namely, the lattice mismatch between these two materials may induce tensile strain in the polarization material, which may allow forming high charge densities (e.g., 2DEG) in a portion of the III-N channel material adjacent to the polarization material. For example, providing a polarization material such as AlGaN to be adjacent to (e.g., in contact with) a III-N channel material such as GaN may induce tensile strain in the polarization material due to the lattice constant of a polarization material such as AlGaN being smaller than that of a III-N channel material such as GaN, which allows forming very high charge densities in the III-N channel material without intentionally adding impurity dopants to the III-N channel material. As a result, high mobility of charge carriers in the III-N channel material may, advantageously, be realized.

Despite the advantages, there are some challenges associated with III-N transistors which hinder their large-scale implementation. One such challenge resides in conventional III-N transistors typically being implemented as depletion mode (i.e., devices that are normally on at zero gate-source voltage) Schottky transistors. While such transistors have the advantages of being able to realize very high frequency and high breakdown voltage operation, they may pose difficulties in terms of biasing, power consumption, and system integration. Therefore, in order to penetrate certain markets, such as a millimeter-wave wireless technology (e.g., fifth generation (5G) wireless technology), viable enhancement mode (e.g., devices that are off at zero gate-source voltage but can be turned on by applying a positive voltage to the gate) III-N transistors are needed. Unfortunately, current enhancement mode III-N transistors are all dielectric-based transistors and dielectrics on M-N semiconductor materials have been shown to have reliability issues like hot carrier effects and bias temperature instability, which limits the high voltage capability of such transistors.

Disclosed herein are IC structures, packages, and device assemblies that include III-N transistor-based cascode arrangements that may simultaneously realize enhancement mode transistor operation and high voltage capability. In one aspect, an IC structure includes a source region, a drain region, an enhancement mode III-N transistor, and a depletion mode III-N transistor, where each of the transistors includes a first and a second source or drain (S/D) terminals (e.g., each of the transistors includes one source terminal and one drain terminal, where the designation of which terminal is the "source terminal" and which terminal is the "drain terminal" may be interchangeable). The transistors are arranged in a cascode arrangement in that the first S/D terminal of the enhancement mode III-N transistor is coupled to the source region, the second S/D terminal of the enhancement mode III-N transistor is coupled to the first S/D terminal of the depletion mode III-N transistor, and the second S/D terminal of the depletion mode III-N transistor is coupled to the drain region. Integrating enhancement and depletion mode III-N transistors on the same wafer using cascode arrangements as described herein may enable high gain as well as high voltage enhancement mode operation at high frequencies. Such cascode arrangements may be particularly suitable for implementing power amplifiers (PAs), low-noise amplifiers (LNAs), and RF switches used in the millimeter-wave wireless technology.

As used herein, the term "III-N semiconductor material" (or, simply, "III-N material") refers to a compound semiconductor material with a first sub-lattice of at least one element from group III of the periodic table (e.g., Al, Ga, In) and a second sub-lattice of nitrogen (N). In some embodiments, any of the III-N channel material, the polarization material, and materials of the source and/or drain (S/D) regions may include different III-N semiconductor materials. These III-N semiconductor materials may be different in terms of, e.g., one or more of their lattice constant (which may be indicative of the fact that these materials have different stoichiometry), bandgap, and/or concentration of dopant atoms.

As used herein, the term "III-N transistor" refers to a field-effect transistor (FET) that includes a III-N material (which may include one or more different III-N materials, e.g., a plurality of different III-N materials stacked over one another) as an active material (e.g., the material in which a conducting channel of the transistor forms during operation, in which context the III-N material is also referred to as a "III-N channel material"). Furthermore, as used herein, the term "enhancement mode III-N transistor" refers to a device or an assembly that includes a III-N channel stack of a III-N channel material and a polarization material, and a gate that is adjacent to the III-N channel stack and includes a stack of a gate electrode material and a gate dielectric, where the device is supposed to be off (e.g., no significant current is supposed to be conducted through the device) at a zero gate-source voltage. In such a device/assembly, a portion of the III-N channel stack on one side of the gate may be seen as a first S/D terminal of the transistor and a portion of the III-N channel stack on the other side of the gate may be seen as a second S/D terminal of the transistor in that, during operation, current is conducted between the first and second S/D terminals. Still further, as used herein, the term "deple-tion mode III-N transistor" refers to a device or an assembly that is similar to the enhancement mode III-N transistor but where the gate may or may not include the gate dielectric material and where the device is supposed to be on (e.g., current is supposed to be conducted through the device) at a zero gate-source voltage.

While discussions provided herein may refer to the two-dimensional charge carrier layers as "2DEG" layers, embodiments described herein are also applicable to systems and material combinations in which 2D hole gas (2DHG) may be formed, instead of 2DEG. Thus, unless stated otherwise, explanations of embodiments referring to 2DEG may be applied to transistors implementing 2DHG instead, all of such embodiments being within the scope of the present disclosure.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations that may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one cascode arrangement as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, PAs, LNAs, RF switches, RF filters (including arrays of RF filters, or RF filter banks), upconverters, downconverters, and duplexers. III-N transistor-based cascode arrangements as described herein may be particularly advantageous for use in RF switches, e.g., to route RF signals to various components of an RFIC (e.g., to PAs, LNAs, antennas, filters, etc.), as well as in PAs and LNAs. In some embodiments, the IC structures as described herein may be employed as part of a chipset for executing one or more related functions in a computer.

Cascode Arrangements with One Enhancement Mode and One Depletion Mode III-N Transistor The first set of embodiments includes III-N transistor-based cascode arrangements with one enhancement mode and one depletion mode III-N transistors integrated over/on a single support structure, each of which arrangements realizing a III-N transistor that is supposed to be off at a zero gate-source and on at a sufficient non-zero gate-source voltage (i.e., realizing an enhancement mode operation).

FIGS. 1A-1E provide cross-sectional side views illustrating different embodiments of an IC structure 100 that includes a cascode arrangement with one enhancement mode III-N transistor 102 and one depletion mode III-N transistor 104, according to some embodiments. Two thick dashed contours shown in the cross-sections of each of FIGS. 1A-1E are intended to illustrate approximate boundaries of what may be considered to be a part of, respectively, the enhancement mode III-N transistor 102 and the depletion mode III-N transistor 104. FIG. 1A further includes an inset outlined with a dotted contour, within which an electrical circuit diagram 180 associated with each of the cascode arrangements of FIGS. 1A-1E is shown. A legend provided within a dashed box at the bottom of each of FIGS. 1A-1E illustrates colors/patterns used to indicate some elements shown in these figures, so that FIGS. 1A-1E are not cluttered by too many reference numerals. For example, each of FIGS. 1A-1E uses different colors/patterns to identify a support structure 108, an insulator 110, a III-N channel material 112, a polarization material 114, S/D regions 116, a S/D contact material 118, a gate dielectric material 120, a gate electrode material 122, a gate contact material 124 to the gate electrode material 122, and a buffer material 126.

The support structure 108 may be any suitable structure, e.g., a substrate, a die, or a chip, on which one or more III-N transistor-based cascode arrangements as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one cascode arrangement as described herein may be built falls within the spirit and scope of the present disclosure.

Although not specifically shown in FIGS. 1A-1E (which, together, may be referred to as "FIG. 1"), in some embodiments, the support structure 108 of the IC structure 100 may include an insulating layer, such as an oxide isolation layer, provided thereon. For example, in some embodiments, a layer of the insulator 110 may be provided over the support structure 108 (not shown in FIG. 1). The insulator 110 may include any suitable insulating material, e.g., any suitable interlayer dielectric (ILD), to electrically isolate the semiconductor material of the support structure 108 from other regions of or surrounding one or more transistor arrangements as described herein. Providing such an insulating layer over the support structure 108 may help mitigate the likelihood that conductive pathways will form through the support structure 108 (e.g., a conductive pathway between the S/D regions 116). Examples of the insulator 110 may include, in some embodiments, silicon oxide, silicon nitride, aluminum oxide, and/or silicon oxynitride. In general, the insulator 110 may be provided in various portions of the IC structure 100. In some embodiments, the insulator 110 may include a continuous insulator material encompassing at least portions of the III-N transistors 102/104 as described herein. In various embodiments, the insulator 110 may include different insulating materials in different portions of the IC structure 100.

In some embodiments, the III-N channel material 112 may be formed of a compound semiconductor with a first sub-lattice of at least one element from group III of the periodic table (e.g., Al, Ga, In), and a second sub-lattice of nitrogen (N). In some embodiments, the III-N channel material 112 may be a binary, ternary, or quaternary III-N compound semiconductor that is an alloy of two, three, or even four elements from group III of the periodic table (e.g., boron, aluminum, indium, gallium) and nitrogen.

In general, the III-N channel material 112 may be composed of various III-N semiconductor material systems including, for example, N-type or P-type III-N materials systems, depending on whether each of the III-N transistors 102 and 104 is an N-type or a P-type transistor (in various embodiments, both may be either N-type or P-type transistors, and, in various embodiments, these two transistors may be of the same or of different types). For some N-type transistor embodiments, the III-N channel material 112 may advantageously be a III-N material having a high electron mobility, such as, but not limited to GaN. In some such embodiments, the III-N channel material 112 may be a ternary III-N alloy, such as InGaN, or a quaternary III-N alloy, such as AlInGaN.

In some embodiments, the III-N channel material 112 may be formed of a highly crystalline semiconductor, e.g., of substantially a monocrystalline semiconductor (possibly with some limited amount of defects, e.g., dislocations). The quality of the III-N channel material 112 (e.g., in terms of defects or crystallinity) may be higher than that of other III-N materials of, or near, the III-N transistors 102, 104 since, during the operation of the III-N transistors 102 and 104, a transistor channel will form in the III-N channel material 112, between the first and second S/D regions 116. A portion of the III-N channel material 112 where a transistor channel of each of the III-N transistors 102 and 104 forms during operation may be referred to as a "III-N channel material/region" of the III-N transistors 102 and 104. The 2DEG that may form in the transistor channel is schematically illustrated in FIGS. 1A-1E with dots (forming a line) in the III-N channel material 112.

In some embodiments, the III-N channel material 112 may be an intrinsic III-N semiconductor material or alloy, not intentionally doped with any electrically active impurity. In alternate embodiments, one or more a nominal impurity dopant level may be present within the III-N channel material 112, for example to set a threshold voltage Vt of the III-N transistors 102/104, or to provide halo pocket implants, etc. In such impurity-doped embodiments however, impurity dopant level within the III-N channel material 112 may be relatively low, for example below $10^{15}$ dopant atoms per cubic centimeter (#/cm$^3$ or, simply, cm'), or below $10^{13}$ cm$^{-3}$.

In some embodiments, a thickness of the III-N channel material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108.

Turning now to the polarization material 114 of the III-N transistors 102 and 104, in general, the polarization material 114 may be a layer of a charge-inducing film of a material having larger spontaneous and/or piezoelectric polarization than that of the bulk of the III-N layer material immediately below it (e.g., the III-N channel material 112), creating a heterojunction (e.g., an interface that occurs between two layers or regions of semiconductors having unequal band gaps) with the III-N channel material 112, and leading to formation of 2DEG at or near (e.g., immediately below) that interface, during operation of the III-N transistors 102 and 104. As described above, a 2DEG layer may be formed during operation of a III-N transistor in a layer of a III-N semiconductor material immediately below a suitable polarization layer. In various embodiments, the polarization material 114 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers. In some embodiments, the polarization material 114 may include any suitable substantially crystalline material having a lattice constant smaller than that of the III-N channel material 112, e.g., at least 3% smaller or at least 5% smaller (e.g., between about 5 and 10% smaller).

Together, the III-N channel material 112 and the polarization material 114 form a III-N channel stack of the III-N transistors 102, 104, where, in some embodiments, the polarization material 114 may be in contact with the III-N channel material 112. In some embodiments, the polarization material 114 may be provided over the III-N channel material 112, as shown in FIG. 1 (e.g., the III-N channel material 112 may be between the polarization material 114 and the support structure 108). However, in other embodiments, not shown in the figures, the III-N channel material 112 may be provided over the polarization material 114 (e.g., the polarization material 114 may be between the III-N channel material 112 and the support structure 108).

As also shown in FIG. 1, the cascode arrangement of the III-N transistors 102, 104 may include two S/D regions 116, where one of the S/D regions 116 is a source region and another one is a drain region, where the "source" and the "drain" designations may be interchangeable, so that the overall structure (e.g., the cascode arrangement of the III-N transistors 102, 104 together with the S/D regions 116) form a device 101 (an approximate boundary of which is shown in each of FIGS. 1A-1E with a dashed-dotted contour) that may be operated as a single transistor (more specifically, an enhancement mode transistor) with gate, source, and drain contacts. As is well-known, in a transistor, S/D regions (also sometimes interchangeably referred to as "diffusion regions") are regions that can supply charge carriers for the transistor channel (e.g., the transistor channel 112) of the transistor (e.g., the III-N transistors 102, 104). In some embodiments, the S/D regions 116 may include doped semiconductor materials, such as doped InGaN. Often, the S/D regions may be highly doped, e.g., with dopant concentrations of at least above $1\times10^{21}$ cm$^{-3}$, in order to advantageously form Ohmic contacts with the respective S/D contacts 140-1 and 140-2 of the S/D contact material 118 of the transistor 101, although these regions may also have lower dopant concentrations in some implementations. Regardless of the exact doping levels, the S/D regions 116 are the regions having dopant concentration higher than in other regions between the source region (e.g., the S/D region 116-1 shown on the left side in each of FIGS. 1A-1E) and the drain region (e.g., the S/D region 116-2 shown on the right side in each of FIGS. 1A-1E), e.g., higher than the III-N channel material 112. For that reason, sometimes the S/D regions 116 are referred to as highly doped (HD) S/D regions. In further embodiments, one or more layers of metal and/or metal alloys may be used to form at least portions of the S/D regions 116.

The S/D contacts 140-1 and 140-2 are configured to form electrical contacts with respective S/D regions 116 (namely, the S/D contact 140-1 may form an electrical contact with the S/D region 116-1 and the S/D contact 140-2 may form an electrical contact with the S/D region 116-2). As such, the S/D contacts 140 may be formed of a S/D contact material 118 which may include any suitable electrically conductive material, alloy, or a stack of multiple electrically conductive materials. In some embodiments, the electrically conductive material 118 of the S/D contacts 140 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 of the S/D contacts 140 may include one or more electrically conductive alloys, oxides, or carbides of one or more metals. In some embodiments, the electrically conductive material 118 of the S/D contacts 140 may include a doped semiconductor, such as silicon or another semiconductor doped with an N-type dopant or a P-type dopant. Metals may provide higher conductivity, while doped semiconductors may be easier to pattern during fabrication. In some embodiments, the S/D contacts 140 may have a thickness between about 2 nanometers and 1000 nanometers, e.g., between about 2 nanometers and 100 nanometers.

FIG. 1 further illustrates a gate 142 and a gate 144, each of which is provided over a respective portion of the III-N channel stack. In some embodiments, the gate 142 of the enhancement mode III-N transistor 102 may include a stack that includes a layer of a gate dielectric material 120 in addition to a gate electrode material 122. On the other hand, in some embodiments, the gate 144 of the depletion mode III-N transistor 104 may only include the gate electrode material 122 but not the gate dielectric material 120, thus forming a Schottky transistor where the gate electrode material 122 interfaces (e.g., is in contact with) the semiconductor material of the III-N channel stack (e.g., is in contact with the polarization material 114). In various embodiments, one or more of the gate 142 and the gate 144 may be provided in a recess in the III-N channel stack, e.g., in a recess in the polarization material 114. In some embodiments, the thickness of the polarization material 114 under the gate 142 may be the same as the thickness of the polarization material 114 under the gate 144. In other embodiments, the thickness of the polarization material 114 under the gated 142 and 144 may be different, e.g., the thickness of the polarization material 114 under each of the gates 142, 144 may be selected to control the threshold voltage of the respective transistor. In some embodiments, the difference in the thicknesses of the polarization material 114 under the gates 142 and 144 may be between about 1 and 15 nanometers, including all values and ranges therein, e.g., between about 1 and 10 nanometers, or between about 2 and 5 nanometers.

The gate dielectric material 120 may be a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode material 122 may include at least one P-type work function metal or N-type work function metal, depending on whether each of the III-N transistors 102, 104 is a P-type metal-oxide-semiconductor (PMOS) transistor or an N-type metal-oxide-semiconductor (NMOS) transistor (e.g., P-type work function metal may be used as the gate electrode material 122 when the III-N transistor 102/104 is a PMOS transistor and N-type work function metal may be used as the gate electrode material 122 when the III-N transistor 102/104 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer. While illustrated in FIG. 1 with the same pattern for the III-N transistors 102 and 104, in various embodiments, material composition of the gate electrode material 122 of the III-N transistor 102 may be the same or different from that of III-N transistor 104 (e.g., in some embodiments, different gate electrode materials may be selected for the III-N transistors 102 and 104 from the gate electrode materials described herein).

Further layers may be included next to the gate electrode material 122 for other purposes, such as to act as a diffusion barrier layer or/and an adhesion layer, not specifically shown in FIG. 1. Furthermore, in some embodiments, the gate dielectric material 120 and/or the gate electrode material 122 may be surrounded by a gate spacer, not shown in FIG. 1, configured to provide electrical separation between the gates of different transistors 102, 104. Such a gate spacer may be made of a low-k dielectric material (e.g., a dielectric material that has a lower dielectric constant (k) than silicon dioxide, which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

FIG. 1 further illustrates a gate contact material 124, which may be an electrically conductive material configured to form an electrical contact to the gate electrode material 122 of the III-N transistors 102 and 104, the electrical contacts shown in FIG. 1 as a gate contact 152 for the III-N transistor 102 and a gate contact 154 for the III-N transistor 104. The gate contact material 124 may include any suitable electrically conductive material, alloy, or a stack of multiple electrically conductive materials. In various embodiments, the gate contacts 152, 154 may include any of the materials described above with reference to the S/D contacts 140. In some embodiments, the gate contacts 152, 154 and the S/D contacts 140 may have substantially the same material composition. In other embodiments, material compositions of one or more pairs of the gate contacts 152, 154 and the S/D contacts 140 may be different. While illustrated in FIG. 1 with the same pattern for the III-N transistors 102 and 104, in various embodiments, material composition of the gate contact 152 of the III-N transistor 102 may be the same or different from the gate contact 154 of the III-N transistor 104 (e.g., in some embodiments, different gate contact materials 124 may be selected for the III-N transistors 102 and 104 from the gate contact materials 124 described herein).

In some embodiments, the IC structure 100 may, optionally, include a buffer material 126 between the III-N channel material 112 and the support structure 108, as shown in FIG. 1. In some embodiments, the buffer material 126 may be a layer of a semiconductor material that has a bandgap larger than that of the III-N channel material 112, so that the buffer material 126 can serve to prevent current leakage from the III-N transistors 102/104 to the support structure 108. A properly selected semiconductor for the buffer material 126 may also enable better epitaxy of the III-N channel material 112 thereon, e.g., it may improve epitaxial growth of the III-N channel material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 126 when the III-N channel material 112 is a semiconductor that includes gallium and nitrogen (e.g., GaN). Other examples of materials for the buffer material 126 may include materials typically used as ILD, described above, such as oxide isolation layers, e.g., silicon oxide, silicon nitride, aluminum oxide, and/or silicon oxynitride. When implemented in the III-N transistors 102/104, the buffer material 126 may have a thickness between about 100 and 5000 nm, including all values and ranges therein, e.g., between about 200 and 1000 nanometers, or between about 250 and 500 nanometers.

Reference numerals 146-1 and 146-2 shown in FIG. 1 are intended to illustrate, respectively, first and second S/D terminals of the III-N transistor 102, while reference numerals 156-1 and 156-2 shown in FIG. 1 are intended to illustrate, respectively, first and second S/D terminals of the III-N transistor 104. In particular, each of FIGS. 1A-1E illustrates that the enhancement mode transistor 101 may be formed by a cascode arrangement of the enhancement mode III-N transistor 102 and the depletion mode III-N transistor 104 with certain terminals of the transistors 102 and 104 being coupled to one another and to S/D regions 116. In particular, as shown in each of FIGS. 1A-1E, the first S/D terminal 146-1 of the enhancement mode III-N transistor 102 may be coupled to the source region 116-1, the second S/D terminal 146-2 of the enhancement mode III-N transistor 102 may be coupled to the first S/D terminal 156-1 of the depletion mode III-N transistor 104, and the second S/D terminal 156-2 of the depletion mode III-N transistor 104 may be coupled to the drain region 116-2. Although not specifically shown in the cross-section illustrations of FIGS. 1A-1E, in some embodiments, the first S/D terminal 146-1 of the enhancement mode III-N transistor 102 may further be coupled to a gate terminal of the depletion mode III-N transistor 104, e.g., by the first S/D terminal 146-1 being coupled to the gate contact 154. In some embodiments, the gate terminal of the depletion mode III-N transistor 104 may be coupled to ground, as illustrated in the electrical circuit diagram 180 shown in FIG. 1A with the gate 144 of the transistor 104 being coupled to a ground potential 160. In some embodiments, the source contact 140-1 may be coupled to the ground 160 as well. The electrical circuit diagram 180 shown in FIG. 1A further illustrates other electrical coupling between various elements of the IC structure 100, as described herein.

The cascode arrangement of the transistor 101 may operate as follows. The depletion mode III-N transistor 104 may remain on with drain-gate voltage being equal to zero or being greater than zero (e.g., by the gate-source voltage on the gate contact 154 being kept at zero volts). The entire branch of the cascode of the III-N transistor 102 and the III-N transistor 104 may then be switched on and off by applying positive voltage to the gate contact/terminal 152 of the enhancement mode III-N transistor 102. In this manner, the enhancement mode transistor 101 is not just a single enhancement mode transistor, but, rather, the single enhancement mode transistor is now replaced by a cascode arrangement of the enhancement mode transistor 102 and the depletion mode transistor 104 as described herein. Such a cascode arrangement may advantageously combine the positive gate voltage enhancement mode device functionality due to the inclusion of the enhancement mode III-N transistor 102 with the high voltage capability provided by the inclusion of the depletion mode III-N transistor 104.

Next, some differences between the various embodiments illustrated in FIGS. 1A-1E will be described. The IC structure 100 shown in FIG. 1A may be seen as the basic structure illustrating the transistor 101 provided by a cascode arrangement of the enhancement mode transistor 102 and the depletion mode transistor 104 as described herein.

Figure 1B:
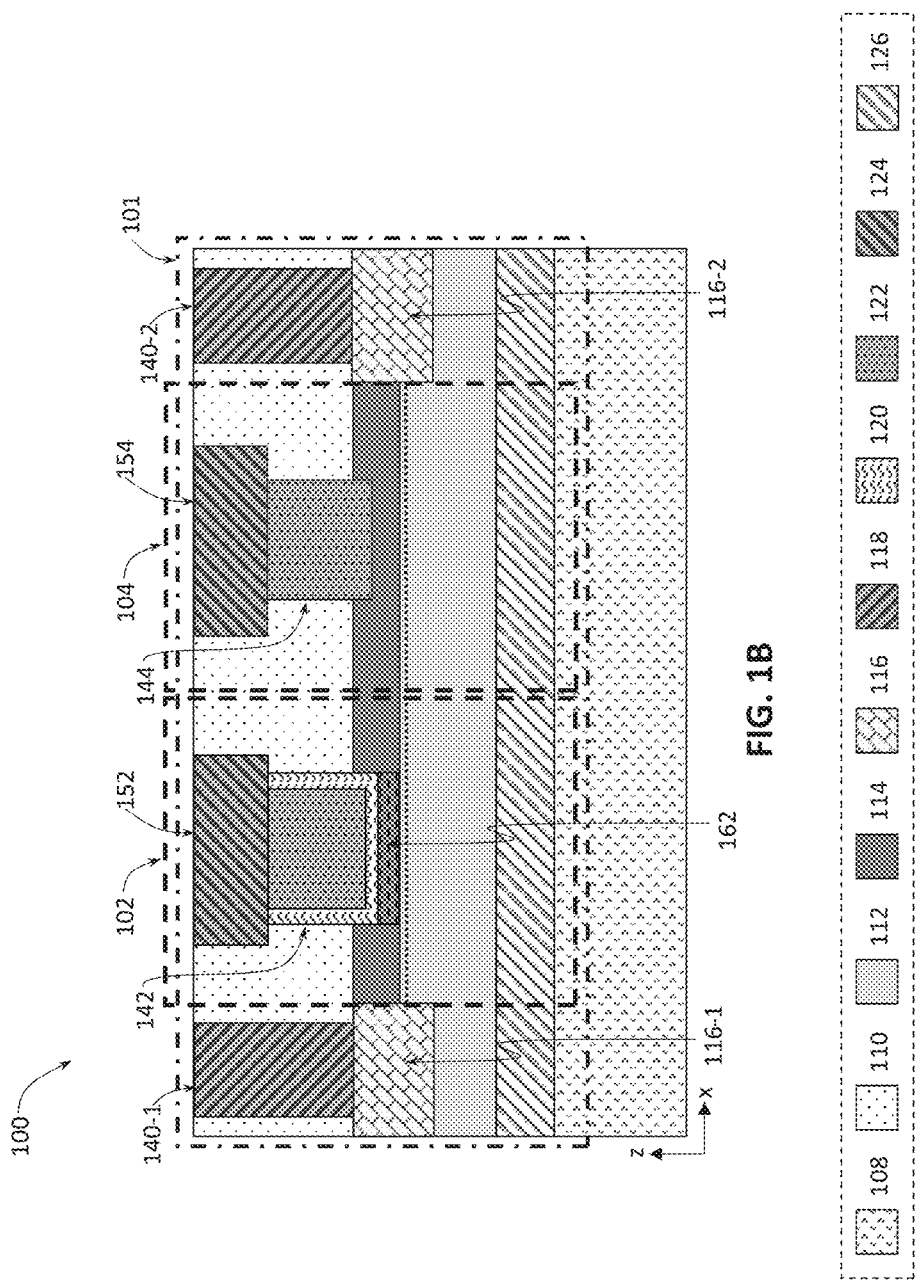

FIG. 1B further illustrates that, in some embodiments, the enhancement mode transistor 102 may include a region 160 between the gate 142 of the enhancement mode III-N transistor 102 and the III-N channel material 112, where the region 160 includes negative charges, e.g., fluorine ions, in concentration of at least about $1 \times 10^{19}$ charges per cubic centimeter ($cm^{-3}$), e.g., at least $1 \times 10^{20}$ $cm^{-3}$ or at least $1 \times 10^{21}$ $cm^{-3}$. In some embodiments, the region 160 may be a region of the polarization material 114 between the gate 142 and the III-N channel material 112. In other words, in some embodiments, a portion of the polarization material 114 between the gate 142 and the III-N channel material 112 may include negative charges in concentrations as described above. Providing the negative charges in the region 160 of the enhancement mode transistor 102 may change the amount of the 2DEG under the gate 142, which may be advantageously used to control the threshold voltage of the enhancement mode transistor 102, e.g., to fine-tune the threshold voltage of the enhancement mode transistor 102, thereby setting the threshold voltage of the transistor 101 of the cascode arrangement of the transistors 102 and 104.

Figure 1C:
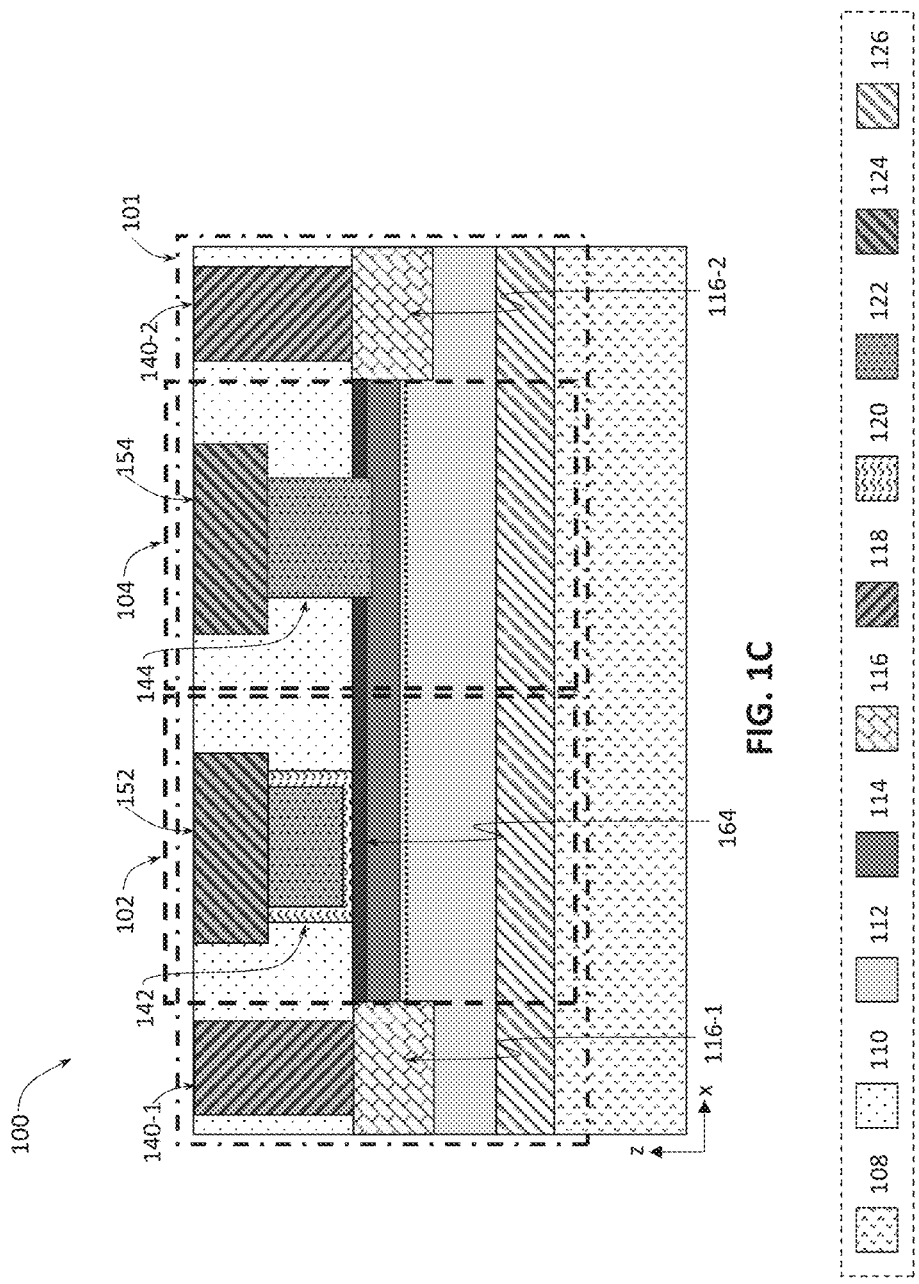

FIG. 1C further illustrates that, in some embodiments, a doped semiconductor material 164 may be included between the gate 142 of the enhancement mode III-N transistor 102 and the polarization material 114. The doped semiconductor material 164 may include any suitable semiconductor material with a concentration of dopant atoms that is at least $1 \times 10^{19}$ $cm^{-3}$, e.g., at least $1 \times 10^{20}$ $cm^{-3}$ or at least $1 \times 10^{21}$ $cm^{-3}$. In some embodiments, the doped semiconductor material 164 may be a doped III-N semiconductor material, e.g., doped GaN, doped AlGaN, or doped AlInGaN. In some embodiments, the doped semiconductor material 164 may be substantially the same III-N semiconductor material as that of either the III-N channel material 112 or of the polarization material 114, but with dopant atoms in concentrations as described above. In other embodiments, the doped semiconductor material 164 may include a semiconductor material different from the III-N channel material 112 and the polarization material 114.

In some embodiments, the dopant atoms of the doped semiconductor material 164 may be P-type dopant atoms, e.g., when the transistor 102 is an NMOS transistor. P-type dopant atoms (also commonly referred to as "acceptors") are dopant atoms that, when added to a semiconductor material, can form a P-type region (i.e., dopant atoms that lack electrons, thereby causing holes to move around the semiconductor material and carry a current, thus acting as charge carriers). If the doped semiconductor material 164 is silicon or another group IV semiconductor material or a combination of materials, then P-type dopants of the doped semiconductor material 164 may include boron, aluminum, or other group III atoms. If the doped semiconductor material 164 is a III-N material, then P-type dopants of the doped semiconductor material 164 may include magnesium, carbon, or zinc. Including a layer of the doped semiconductor material 164 with P-type dopant adds negative charges to where the doped semiconductor material 164 is provided. For example, when substituting a silicon atom in the crystal lattice of the semiconductor material 164 with an acceptor dopant atom, three of the valence electrons of the dopant atom (e.g., boron or aluminum) may form covalent bonds with three of the neighboring silicon atoms but the bond with the fourth neighbor remains unsatisfied and the initially electro-neutral acceptor dopant atom becomes negatively charged (ionized). Thus, providing the doped semiconductor material 164 may provide means for affecting distribution of the 2DEG in the IC structure 100, e.g., to control the threshold voltage of the transistor 102, and, thereby, of the transistor 101. In some embodiments, the doped semiconductor material 164 may be present under the gate 142 of the enhancement mode III-N transistor 102 but absent under the gate 144 of the depletion mode III-N transistor 102, as shown in FIG. 1C. Thus, in such embodiments, the gate 144 (e.g., the gate electrode material 122) of the depletion mode III-N transistor 104 may interface (e.g., be in contact with) the polarization material 114, while the gate 142 (e.g., the gate electrode material 122) of the enhancement mode III-N transistor 102 may interface (e.g., be in contact with) the doped semiconductor material 164. In some embodiments, the doped semiconductor material 164 may be a substantially continuous layer of the material extending between the source region 116-1 and the drain region 116-2 over the III-N channel stack everywhere except for the region under the gate 144 of the depletion mode III-N transistor 102, as shown in FIG. 1C.

In some embodiments, the doped semiconductor material 164 may have a thickness between about 1 nanometer and 15 nanometers, including all values and ranges therein, e.g., between about 1 and 10 nanometers, or between about 1 and 3 nanometers. In some embodiments, the doped semiconductor material 164 may be an epitaxially grown material. Employing epitaxial growth to provide the doped semiconductor material 164 using a suitable combination of precursors, including desired dopant atoms, may be particularly beneficial for achieving the relatively small thicknesses of the doped semiconductor material 164 as described herein.

Figure 1D:
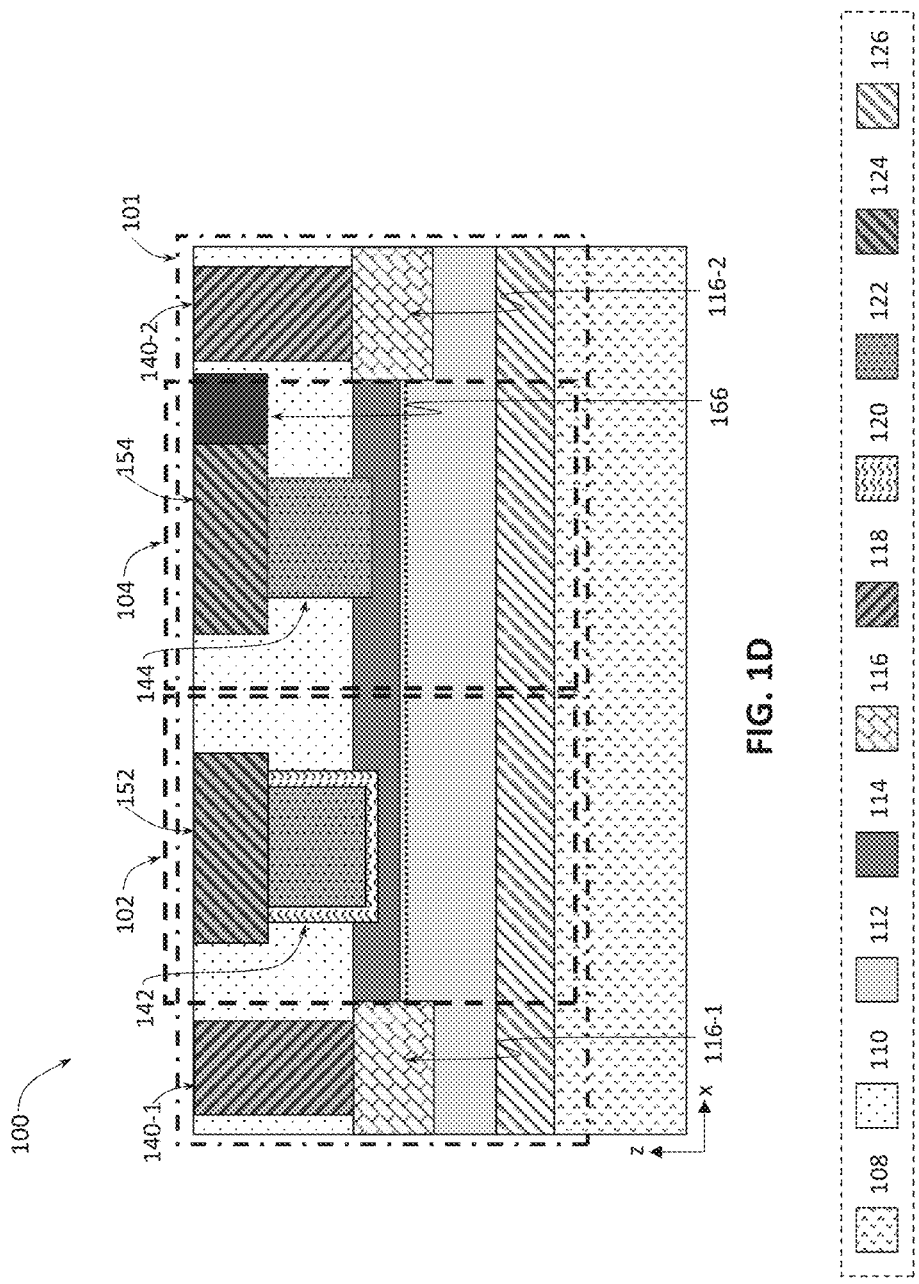

FIG. 1D further illustrates that, in some embodiments, a field plate structure 166 may be coupled to the gate of the depletion mode III-N transistor 104 (e.g., by being coupled to the gate contact 154 and/or to the gate electrode material 122 of the III-N transistor 104), which structure may, therefore, be referred to as a "gate field plate structure" 166. The gate field plate structure 166 may include any suitable electrically conductive material, e.g., any of the materials described above with reference to the electrically conductive materials 118 and 124.

In some embodiments, the gate field plate structure 166 may be arranged to extend over at least a portion of the III-N channel stack between the gate 144 of the depletion mode III-N transistor 104 and the drain region 116-2. In other words, the gate field plate structure 166 may be arranged to extend over at least a portion of the III-N channel stack from the gate 144 towards the drain region 116-2. In some embodiments, the gate field plate structure 166 may be provided in the insulator material 110 above the III-N channel stack, as shown in FIG. 1D. However, in other embodiments, not shown in the present figures, the gate field plate structure 166 may be provided in the III-N channel material 112 below the polarization layer 114 (e.g., at the "backside" of the IC structure 100, if the "front" of the IC structure 100 is where the gates 142 and 144 of the top-gated III-N transistors 102, 104 are provided). The gate field plate structure 166 may enable manipulation of the distribution of electric field at the transistor drain and thereby enhance the breakdown voltage of the transistor 104, and, thereby, of the transistor 101. Although not specifically shown in FIG. 1D, in some embodiments, the field plate structure 166 may be coupled to a suitable bias source instead of the gate electrode so that, during operation of the transistor 101, a suitable bias signal may be applied to the field plate structure 166 to affect the distribution of the electric field in the transistor 101 in the desired manner. Although also not shown in FIG. 1D, in other embodiments, the field plate structure 166 may be coupled to a ground potential.

Figure 1E:
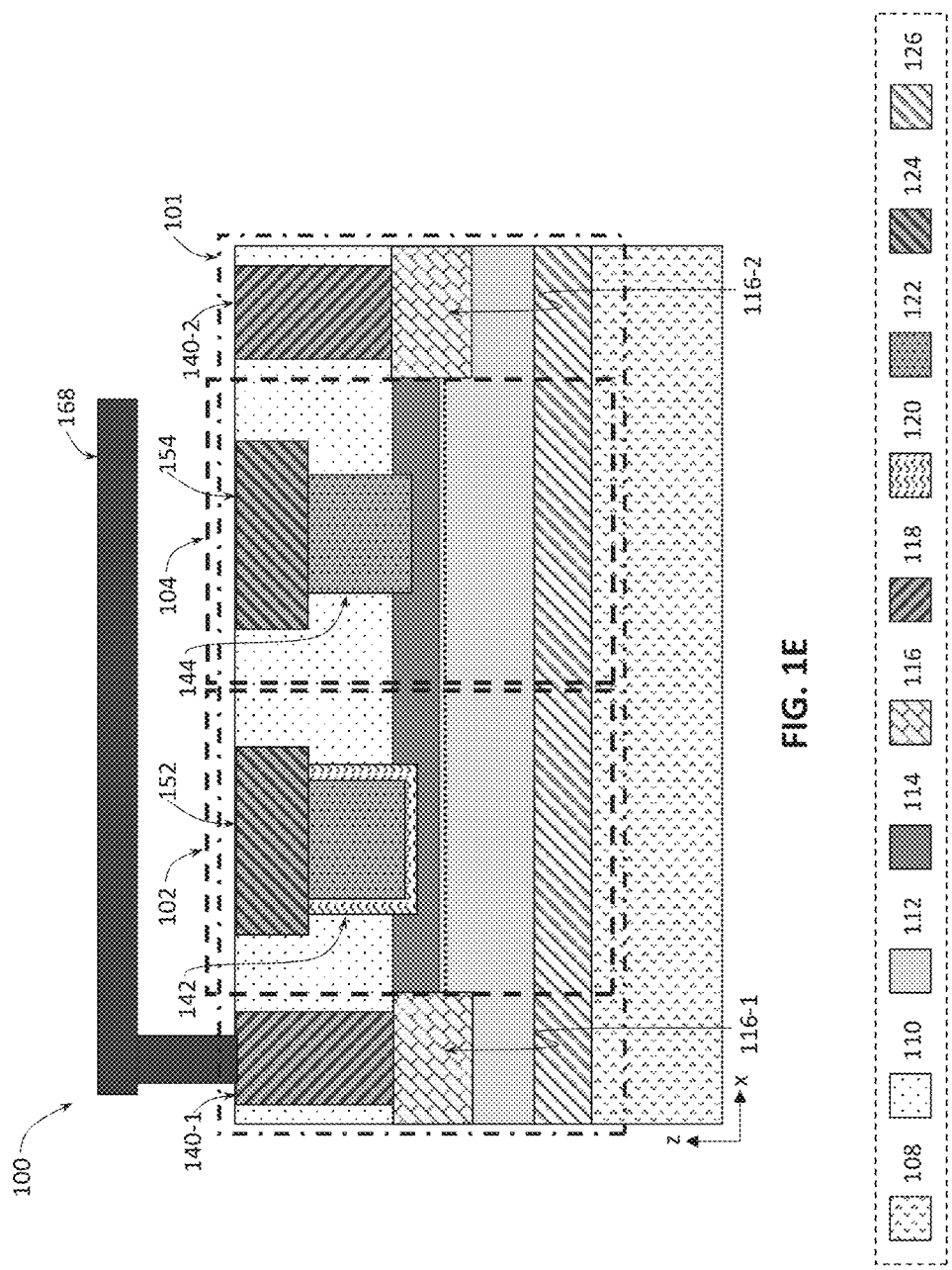

FIG. 1E further illustrates that, in some embodiments, a field plate structure 168 may be coupled to the source region 116-1 (e.g., by being coupled to the source contact 140-1), which structure may, therefore, be referred to as a "source field plate structure" 168. Similar to the gate field plate structure 166, the source field plate structure 168 may include any suitable electrically conductive material, e.g., any of the materials described above with reference to the electrically conductive materials 118 and 124.

In some embodiments, the source field plate structure 168 may be arranged to extend over at least a portion of the III-N channel stack between the source region 116-1 and the depletion mode III-N transistor 104, towards the drain region 116-2. In other words, the source field plate structure 168 may be arranged to extend over at least a portion of the III-N channel stack from the source contact 140-1 towards the depletion mode III-N transistor 104. In some embodiments, the source field plate structure 168 may be provided in the insulator material 110 above the III-N channel stack, even though the insulator 110 is not shown around the source field plate structure 168 in FIG. 1E. However, in other embodiments, not shown in the present figures, the source field plate structure 168 may be provided in the III-N channel material 112 below the polarization layer 114 (e.g., at the "backside" of the IC structure 100). Similar to the gate field plate structure 166, the source field plate structure 168 may enable manipulation of the distribution of electric field at the transistor drain and thereby enhance the breakdown voltage of the transistor 104, and, thereby, of the transistor 101. Although not specifically shown in FIG. 1E, in some embodiments, the source field plate structure 168 may be coupled to a suitable bias source so that, during operation of the transistor 101, a suitable bias signal may be applied to the source field plate structure 168 to affect the distribution of the electric field in the transistor 101 in the desired manner. Although also not shown in FIG. 1E, in other embodiments, the source field plate structure 168 may be coupled to a ground potential.

In various embodiments, the IC structure 100 may include any combination of features described with reference to FIGS. 1A-1E.

Although not specifically shown in FIG. 1, the IC structure 100 may further include additional cascode arrangements implementing transistors similar to the transistor 101, described above.

Cascode Arrangements with One Enhancement Mode and One Depletion Mode III-N Transistors Coupled by an Intermediate Node The second set of embodiments includes III-N transistor-based cascode arrangements with an intermediate node coupling one enhancement mode and one depletion mode III-N transistors integrated over/on a single support structure, each of which arrangements realizing enhancement mode operation.

Figure 2:
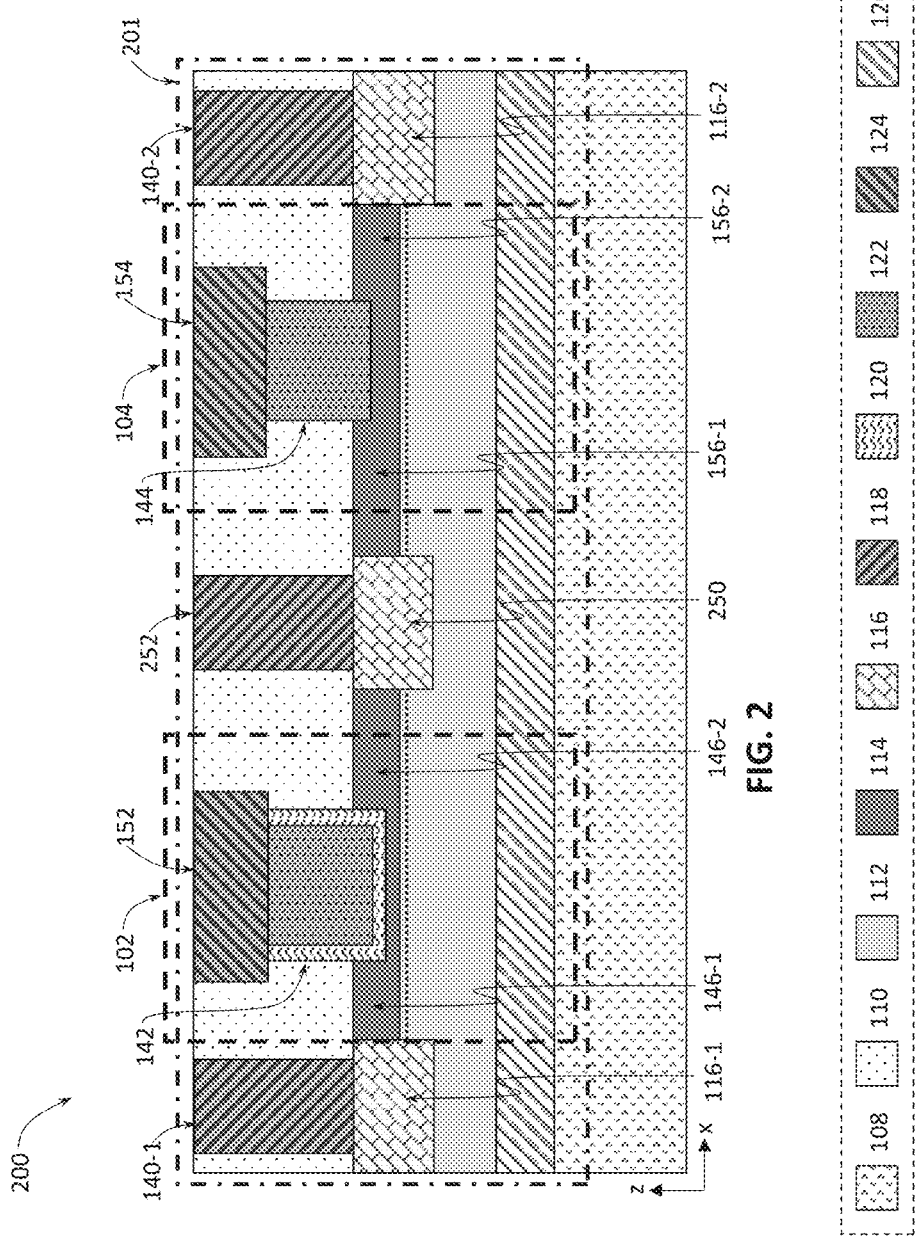
FIG. 2 provides a cross-sectional side view illustrating an IC structure that includes a cascode arrangement with one enhancement mode III-N transistor, one depletion mode III-N transistor, and an intermediate node, according to some embodiments.

FIG. 2 provides a cross-sectional side view illustrating an IC structure 200 that includes a cascode arrangement with one enhancement mode III-N transistor 102, one depletion mode III-N transistor 104, and an intermediate node region 250, according to some embodiments. The view shown in FIG. 2 is similar to that shown in FIG. 1A and include some elements with the same reference numerals. Therefore, descriptions provided with reference to FIG. 1A are applicable to the IC structure 200 of FIG. 2 and, in the interests of brevity, are not repeated here. Instead, only the differences are described. Similar to FIG. 1A, a legend provided within a dashed box at the bottom of FIG. 2 illustrates colors/patterns used to indicate some materials or elements shown in FIG. 2. Also similar to FIG. 1A, the 2DEG is schematically indicated in FIG. 2 with dots (forming a line) in the portion of the III-N channel material 112 that interfaces the polarization material 114.

In particular, FIG. 2 illustrates that, in some embodiments, the enhancement mode III-N transistor 102 and the depletion mode III-N transistor 104 may be coupled to one another through the intermediate node region 250 in the III-N channel stack. For example, the second S/D terminal 146-2 of the enhancement mode III-N transistor 102 may be coupled to the first S/D terminal 156-1 of the depletion mode III-N transistor 104 by virtue of the second S/D terminal 146-2 of the enhancement mode III-N transistor 102 being coupled to the intermediate node region 250, and the intermediate node region 250 being coupled to the first S/D terminal 156-1 of the depletion mode III-N transistor 104. The transistor 201 of FIG. 2 may be substantially analogous cascode arrangement as that forming the transistor 101 of FIG. 1A, the descriptions of which, therefore, are not repeated, except that the transistor 201 may further include the intermediate node region 250 as described herein.

In some embodiments, the intermediate node region 250 may include a doped semiconductor material with a dopant concentration of at least $10^{19}$ cm$^{-3}$, e.g., of at least $1 \times 10^{20}$ cm$^{-3}$ or of at least $1 \times 10^{21}$ cm$^{-3}$. In some embodiments, an intermediate contact 252 may be coupled to the intermediate node region 250, where the intermediate contact 252 may include any suitable electrically conductive materials described herein, e.g., with reference to the electrically conductive materials 118 or 124. In some embodiments, during operation, the intermediate contact 252 and/or the intermediate node region 250 may be electrically floating (e.g., not electrically connected to anything). Some advantages of providing the intermediate node in the form of the intermediate node region 250 and the intermediate contact 252 include reduction in gate-gate capacitance coupling between the enhancement-mode gate contact 142/152 and depletion-mode gate contact 144/154 leading to a better voltage partitioning between the two transistors.

Although not specifically illustrated in FIG. 2, in further embodiments, any of the features described with reference to FIGS. 1A-1E, or any combination of such features, may be included in the IC structure 200.

Although not specifically shown in FIG. 2, the IC structure 200 may further include additional transistors similar to the III-N transistor 201, described above.

Cascode Arrangements with Two Enhancement Mode and One Depletion Mode III-N Transistors The third set of embodiments includes III-N transistor-based cascode arrangements with multiple (e.g., 2) enhancement mode III-N transistors and one depletion mode III-N transistor integrated over/on a single support structure, each of which arrangements may also realize enhancement mode operation.

Figure 3:
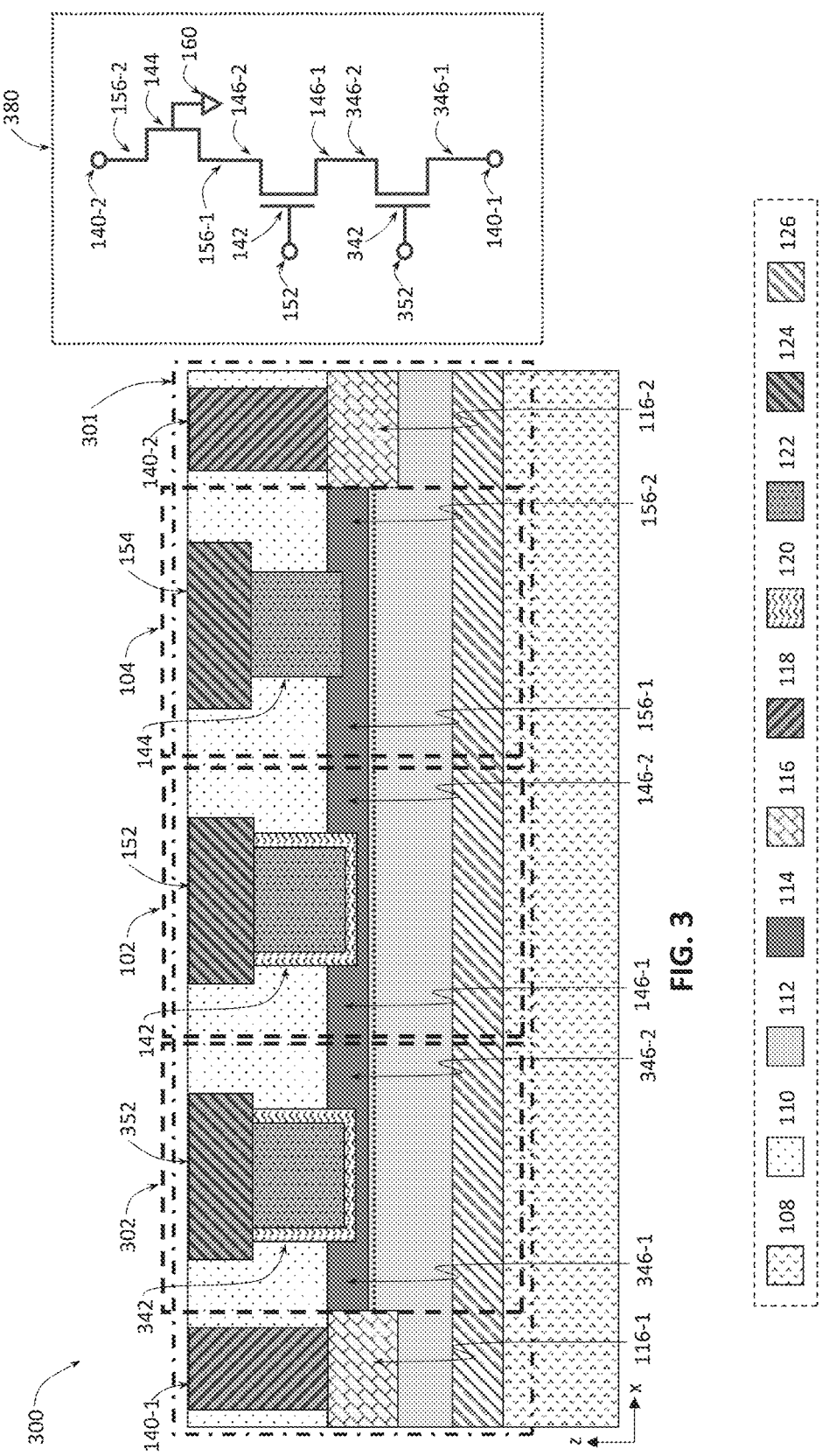
FIG. 3 provides a cross-sectional side view illustrating an IC structure that includes a cascode arrangement with two enhancement mode III-N transistors and one depletion mode III-N transistor, according to some embodiments.

FIG. 3 provides a cross-sectional side view illustrating an IC structure 300 that includes a cascode arrangement with two enhancement mode III-N transistors 102 and 302 and one depletion mode III-N transistor 104, according to some embodiments. The view shown in FIG. 3 is similar to that shown in FIG. 1A and include some elements with the same reference numerals. Therefore, descriptions provided with reference to FIG. 1A are applicable to the IC structure 300 of FIG. 3 and, in the interests of brevity, are not repeated here. Instead, only the differences are described. Similar to FIG. 1A, a legend provided within a dashed box at the bottom of FIG. 3 illustrates colors/patterns used to indicate some materials or elements shown in FIG. 3. Also similar to FIG. 1A, the 2DEG is schematically indicated in FIG. 3 with dots (forming a line) in the portion of the III-N channel material 112 that interfaces the polarization material 114. FIG. 3 further includes an inset outlined with a dotted contour, within which an electrical circuit diagram 380 associated with the cascode arrangement of FIG. 3 is shown. Similar to the electrical circuit diagram 180 shown in FIG. 1A, the electrical circuit diagram 380 further illustrates various aspects of the electrical coupling between various elements of the IC structure 300, as described herein.

The enhancement mode III-N transistor 302 shown in FIG. 3 may be substantially analogous to the enhancement mode III-N transistor 102, described above, with the gate 342 being analogous to the gate 142 and the gate contact 342 being analogous to the gate contact 352, descriptions of which elements are, therefore, not repeated here. The transistor 301 of FIG. 3 may be substantially analogous cascode arrangement as that forming the transistor 101 of FIG. 1A, the descriptions of which, therefore, are not repeated, except that the transistor 301 may further include the enhancement mode III-N transistor 302 as described herein.

Similar to the transistor 302, the enhancement mode III-N transistor 302 may include a first S/D terminal 346-1 and a second S/D terminal 346-2. In particular, FIG. 3 illustrates that, in some embodiments, the first S/D terminal 146-1 of the first enhancement mode III-N transistor 102 may be coupled to the source region 116-1 through the second enhancement mode III-N transistor 302. For example, the first S/D terminal 146-1 of the first enhancement mode III-N transistor 102 may be coupled to the source region 116-1 by the first S/D terminal 346-1 of the second enhancement mode III-N transistor 302 being coupled to the source region 116-1 and the second S/D terminal 346-2 of the second enhancement mode III-N transistor 304 being coupled to the first S/D terminal 146-1 of the first enhancement mode III-N transistor 102. In further embodiments, additional enhancement mode III-N transistors may be included in the IC structure 300, coupled between or to one or both of the first and second enhancement mode III-N transistors 102 and 302.

Although not specifically illustrated in FIG. 3, in further embodiments, any of the features described with reference to FIGS. 1A-1E, or any combination of such features, as well as any of the features described with reference to FIG. 2, may be included in the IC structure 300.

Although not specifically shown in FIG. 3, the IC structure 300 may further include additional transistors similar to the III-N transistor 301, described above.

Cascode Arrangements with One Enhancement Mode and Two Depletion Mode III-N Transistors The fourth set of embodiments includes III-N transistor-based cascode arrangements with one enhancement mode III-N transistor and multiple (e.g., 2) depletion mode III-N transistors integrated over/on a single support structure, each of which arrangements may also realize enhancement mode operation.

Figure 4:
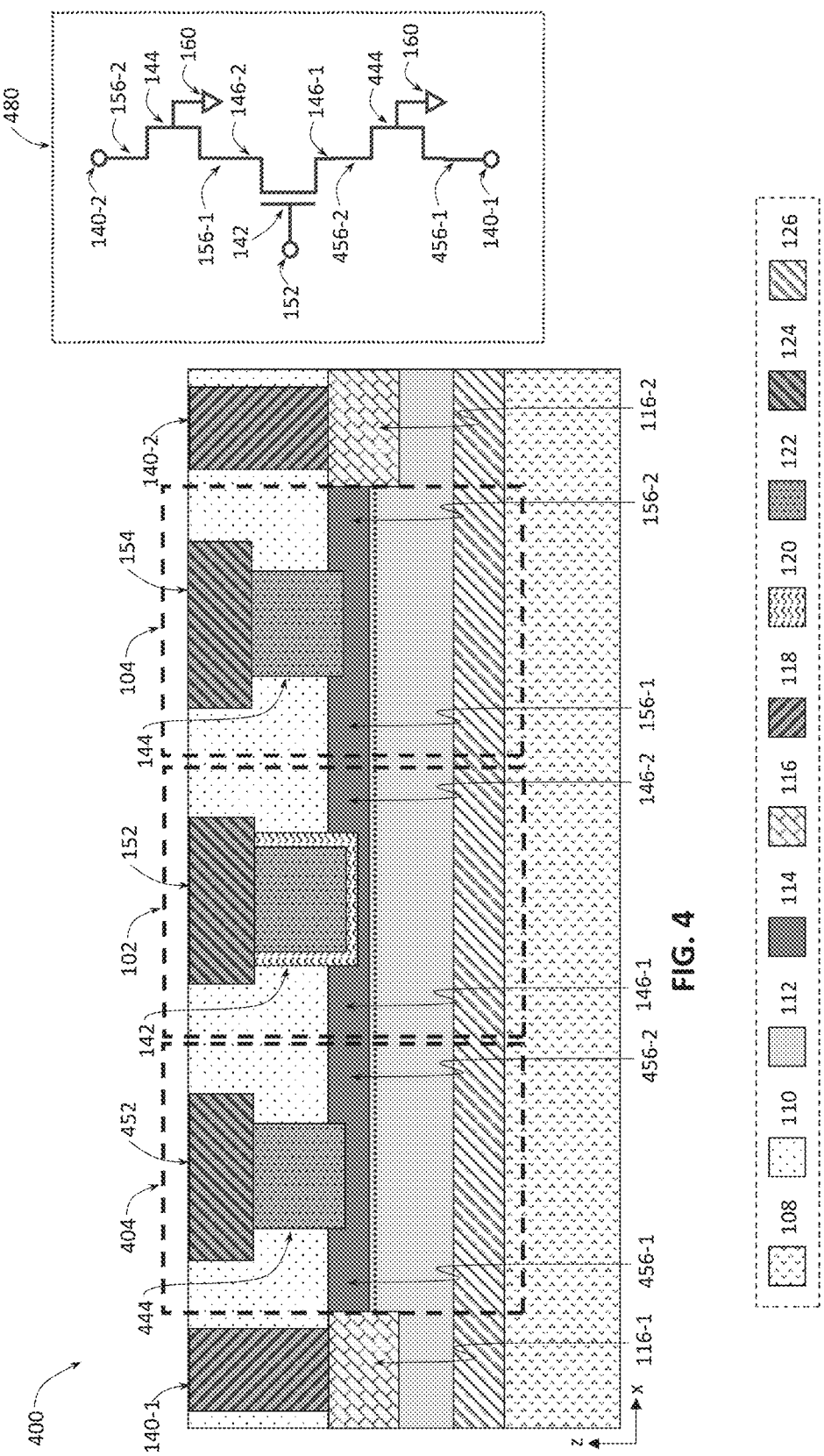
FIG. 4 provides a cross-sectional side view illustrating an IC structure that includes a cascode arrangement with one enhancement mode III-N transistor and two depletion mode III-N transistors, according to some embodiments.

FIG. 4 provides a cross-sectional side view illustrating an IC structure 400 that includes a cascode arrangement with one enhancement mode III-N transistor 102 and two depletion mode M-N transistors 104 and 404, according to some embodiments. The view shown in FIG. 4 is similar to that shown in FIG. 1A and include some elements with the same reference numerals. Therefore, descriptions provided with reference to FIG. 1A are applicable to the IC structure 400 of FIG. 4 and, in the interests of brevity, are not repeated here. Instead, only the differences are described. Similar to FIG. 1A, a legend provided within a dashed box at the bottom of FIG. 4 illustrates colors/patterns used to indicate some materials or elements shown in FIG. 4. Also similar to FIG. 1A, the 2DEG is schematically indicated in FIG. 4 with dots (forming a line) in the portion of the III-N channel material 112 that interfaces the polarization material 114. FIG. 4 further includes an inset outlined with a dotted contour, within which an electrical circuit diagram 480 associated with the cascode arrangement of FIG. 4 is shown. Similar to the electrical circuit diagram 180 shown in FIG. 1A, the electrical circuit diagram 480 further illustrates various aspects of the electrical coupling between various elements of the IC structure 400, as described herein.

The depletion mode III-N transistor 404 shown in FIG. 4 may be substantially analogous to the depletion mode III-N transistor 104, described above, with the gate 444 being analogous to the gate 144 and the gate contact 452 being analogous to the gate contact 152, descriptions of which elements are, therefore, not repeated here. The transistor 401 of FIG. 4 may be substantially analogous cascode arrangement as that forming the transistor 101 of FIG. 1A, the descriptions of which, therefore, are not repeated, except that the transistor 401 may further include the depletion mode III-N transistor 404 as described herein.

Similar to the transistor 404, the depletion mode III-N transistor 404 may include a first S/D terminal 456-1 and a second S/D terminal 456-2. In particular, FIG. 4 illustrates that, in some embodiments, the first S/D terminal 146-1 of the first enhancement mode III-N transistor 102 may be coupled to the source region 116-1 through the second depletion mode III-N transistor 404. For example, the first S/D terminal 146-1 of the first enhancement mode III-N transistor 102 may be coupled to the source region 116-1 by the first S/D terminal 456-1 of the second depletion mode III-N transistor 404 being coupled to the source region 116-1 and the second S/D terminal 456-2 of the second depletion mode III-N transistor 404 being coupled to the first S/D terminal 146-1 of the first enhancement mode III-N transistor 102. In further embodiments, additional depletion mode III-N transistors may be included in the IC structure 400, coupled between or to any one of the transistors 102, 104, and 404. Some advantages of including multiple depletion mode III-N transistors coupled in this manner include having high voltage capability from the gate of the enhancement-mode transistor 102 to the source region 116-1 as well as drain region 116-2, which might be particularly useful for symmetric applications such as high voltage switches where both high gate-source and high gate-drain breakdown is required.

Although not specifically illustrated in FIG. 4, in further embodiments, any of the features described with reference to FIGS. 1A-1E, or any combination of such features, as well as any of the features described with reference to FIG. 2, may be included in the IC structure 400.

Although not specifically shown in FIG. 4, the IC structure 400 may further include additional transistors similar to the III-N transistor 401, described above.

Variations and Implementations

The IC structures 100, 200, 300, and 400 illustrated in FIGS. 1-4 do not represent an exhaustive set of assemblies in which III-N transistor-based cascode arrangements as described herein may be implemented, but merely provide examples of such structures/assemblies.

Although particular arrangements of materials are discussed with reference to FIGS. 1-4, intermediate materials may be included in various portions of these figures. Note that FIGS. 1-4 are intended to show relative arrangements of some of the components therein, and that various device components of these figures may include other components that are not specifically illustrated, e.g., various interfacial layers or various additional layers or elements. For example, although not specifically shown, the IC structures 100, 200, 300, and 400 may include a solder resist material (e.g., polyimide or similar material) and one or more bond pads formed on upper-most interconnect layer of the IC structure, e.g., at the top of the IC structures 100, 200, 300, and 400 shown in FIGS. 1-4. The bond pads may be electrically coupled with a further interconnect structure and configured to route the electrical signals between one or more contacts of the transistor arrangements shown in FIGS. 1-4 and various external devices. For example, solder bonds may be formed on the one or more bond pads to mechanically and/or electrically couple a chip including the IC structures 100, 200, 300, and 400 with other components (e.g., a circuit board). The IC structures 100, 200, 300, and 400 may have other alternative configurations to route the electrical signals from the interconnect layers, e.g., the bond pads described above may be replaced by or may further include other analogous features (e.g., posts) that route the electrical signals to external components.

Furthermore, although the III-N transistors are shown in the figures with the III-N channel material 112 being between the polarization material 114 and the support structure 108 and with the polarization material 114 being between the III-N channel material 112 and the gates 142, 144, in other embodiments, the polarization material 114 may be between the III-N channel material 112 and the support structure 108, and the III-N channel material 112 may be between the polarization material 114 and the gates 142, 144. In such embodiments, the 2DEG may be formed just above the interface of the polarization material 114 and the III-N channel material 112 (e.g., further away from the support structure 108 than the polarization material 114). Also, in such embodiments, the gates 142, 144 may be provided in a recess in the III-N channel material 112 so that the gates are relatively close to the 2DEG.

Still further, although the gate 142 of the enhancement mode III-N transistor 102 is shown to include the gate dielectric material 120, in other embodiments the gate dielectric material 120 may be excluded from the enhancement mode III-N transistor 102. In such embodiments, the gate electrode material 122 of the gate 142 may form a Schottky contact with the semiconductor material of the III-N channel stack (e.g., either with the polarization material 114 or the III-N channel material 112, depending on whether the polarization material 114 is above the III-N channel material 112 as shown in the present figures, or below the III-N channel material 112 as described above).

Similarly, although the gate 144 of the depletion mode III-N transistor 104 is shown to be excluded from the gate dielectric material 120, in other embodiments the gate dielectric material 120 may be included in the depletion mode III-N transistor 104. In such embodiments, the gate electrode material 122 of the gate 144 may be in contact with the gate dielectric material 120 of the gate 144, and the gate dielectric material 120 may be in contact with the semiconductor material of the III-N channel stack (e.g., either with the polarization material 114 or the III-N channel material 112, depending on whether the polarization material 114 is above the III-N channel material 112 as shown in the present figures, or below the III-N channel material 112 as described above).

Additionally, although some elements of the IC structures are illustrated in FIGS. 1-4 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-4 may illustrate various elements, e.g., the S/D regions 116, the S/D contacts 140, the gate electrode material 122, etc., as having perfectly straight sidewall profiles, e.g., profiles where the sidewalls extend perpendicularly to the support structure 108, these idealistic profiles may not always be achievable in real-world manufacturing processes. Namely, while designed to have straight sidewall profiles, real-world openings that may be formed as a part of fabricating various elements of the IC structures shown in FIGS. 1-4 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of transistor arrangements provided herein are equally applicable to embodiments where various elements of such IC structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the presence of one or more transistor arrangements as described herein.

In some embodiments, various embodiments of the IC structures 100, 200, 300, and 400 may be included in, or used to implement at least a portion of an RF FE. In some embodiments, the III-N transistors of the IC structures 100, 200, 300, and 400 may be included in, or used to implement at least a portion of an RF circuit, e.g., a PA, an LNA, an RF switch, or a part of a power circuit included in the IC structure. In some embodiments, various embodiments of the IC structures 100, 200, 300, and 400 may be included in, or used to implement at least a portion of a complementary metal oxide semiconductor (CMOS) included in the IC structure (e.g., control logic, current mirrors, level shifters, buffers, power gating, etc.).

In some embodiments, III-N transistor-based cascode arrangements as described herein may be modified so that features of various IC structures 100, 200, 300, and 400 may be combined. Some of these combinations have been describe above, but further variations and combinations of such III-N transistor-based cascode arrangements of the IC structures described herein are possible and are within the scope of the present disclosure.

Example Structures and Devices with III-N Transistor-Based Cascode Arrangements

IC structures that include at least one cascode arrangement as disclosed herein may be included in any suitable electronic device. FIGS. 5-9 illustrate various examples of devices and components that may include at least one cascode arrangement, e.g., at least one III-N transistor, as disclosed herein.

Figure 5B:
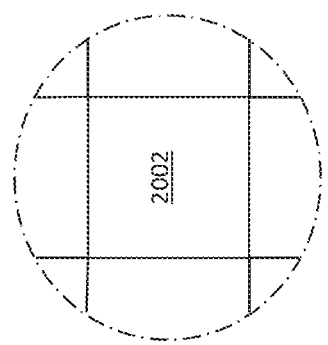
FIGS. 5A-5B are top views of a wafer and dies that include one or more IC structures having at least one cascode arrangement in accordance with one or more embodiments.
Figure 5A:
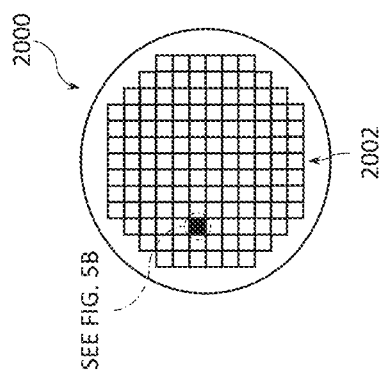

FIGS. 5A-5B are top views of a wafer 2000 and dies 2002 that may include at least one cascode arrangement in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including at least one cascode arrangement as described herein). After the fabrication of the semiconductor product is complete (e.g., after manufacture of at least one transistor arrangement as described herein, e.g., after manufacture of any embodiment of the IC structures 100, 200, 300, and 400 described herein), the wafer 2000 may undergo a singulation process in which each of the dies 2002 is separated from one another to provide discrete "chips" of the semiconductor product. In particular, devices that include at least one cascode arrangement as disclosed herein may take the form of the wafer 2000 (e.g., not singulated) or the form of the die 2002 (e.g., singulated). The die 2002 may include one or more III-N transistors as described herein, as well as, optionally, supporting circuitry to route electrical signals to these transistors and other devices, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

FIG. 6 is a side, cross-sectional view of an example IC package 2200 that may include an IC structure with at least one cascode arrangement in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having at least one cascode arrangement as described herein. In embodiments in which the IC package 2200 includes multiple dies 2256, the IC package 2200 may be referred to as a multi-chip-package (MCP). The dies 2256 may include circuitry to perform any desired functionality. For example, one or more of the dies 2256 may be RF FE dies which may include one or more IC structures having at least one cascode arrangement as described herein, one or more of the dies 2256 may be logic dies (e.g., silicon-based dies), one or more of the dies 2256 may be memory dies (e.g., high bandwidth memory), etc. In some embodiments, any of the dies 2256 may include III-N transistor-based cascode arrangements as discussed above; in some embodiments, at least some of the dies 2256 may not include any III-N transistor-based cascode arrangements as described herein.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
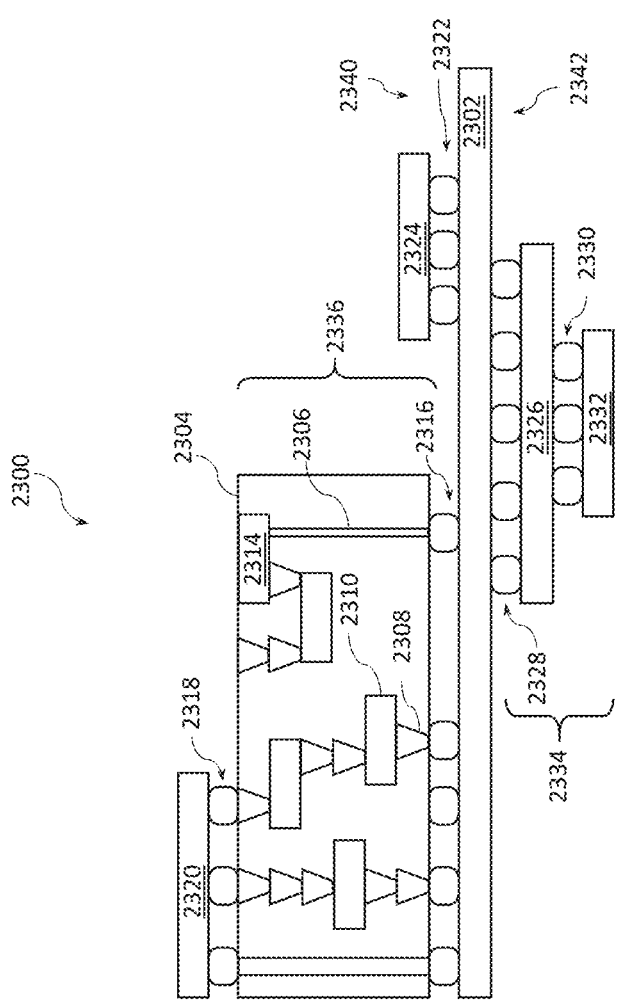
FIG. 7 is a cross-sectional side view of an IC device assembly that may include one or more IC structures having at least one cascode arrangement in accordance with one or more embodiments.

FIG. 7 is a cross-sectional side view of an IC device assembly 2300 that may include components having one or more IC structures implementing at least one cascode arrangement in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing at least one cascode arrangement in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include at least one cascode arrangement as described herein in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include at least one cascode arrangement as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, PAs, power management devices, antennas, arrays, sensors, and microelectromechanical systems (MEMS) devices may also be formed on the interposer 2304. In some embodiments, the IC structures implementing at least one cascode arrangement as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
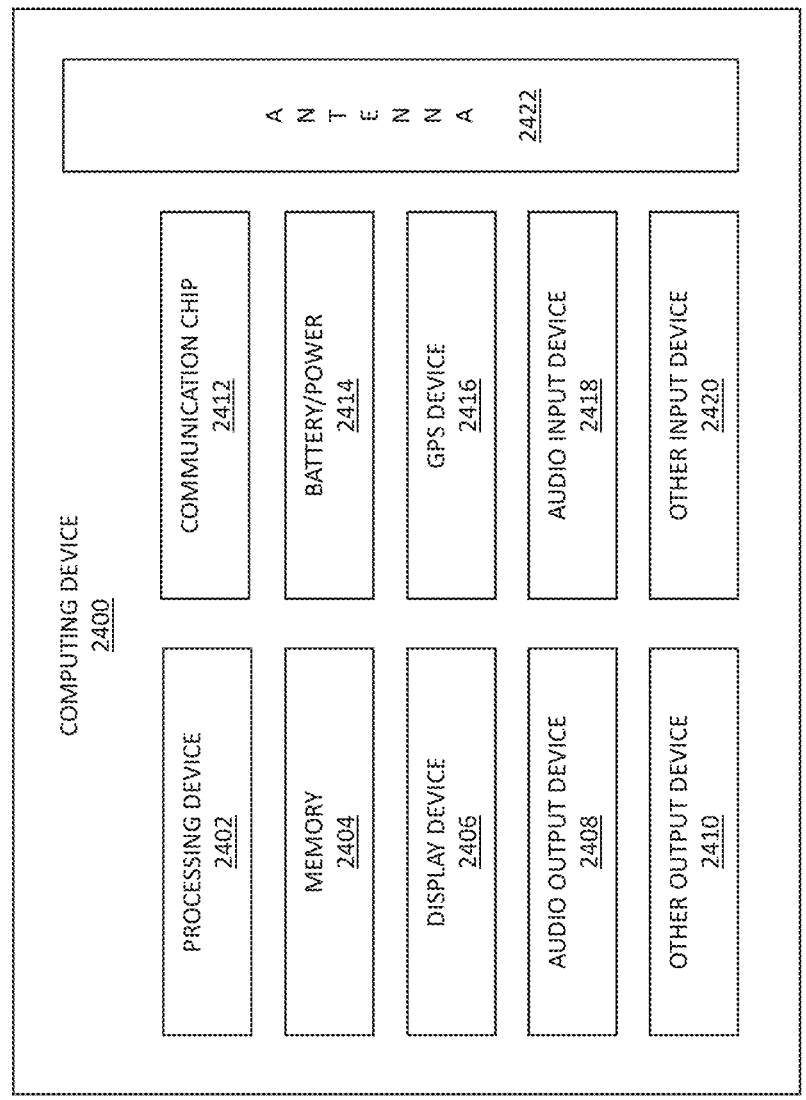
FIG. 8 is a block diagram of an example computing device that may include one or more IC structures having at least one cascode arrangement in accordance with one or more embodiments.

FIG. 8 is a block diagram of an example computing device 2400 that may include one or more components with one or more IC structures having at least one cascode arrangement in accordance with any of the embodiments disclosed herein. For example, any suitable ones of the components of the computing device 2400 may include a die (e.g., the die 2002 (FIG. 5B)) including at least one cascode arrangement in accordance with any of the embodiments disclosed herein. Any of the components of the computing device 2400 may include an IC device (e.g., any embodiment of the IC structures of FIGS. 1-4) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures, in particular III-N transistor-based cascode arrangements as described herein, may be used to implement one or more of RF switches, PAs, LNAs, filters (including arrays of filters and filter banks), upconverters, downconverters, and duplexers, e.g., as a part of implementing the communication chips 2412.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
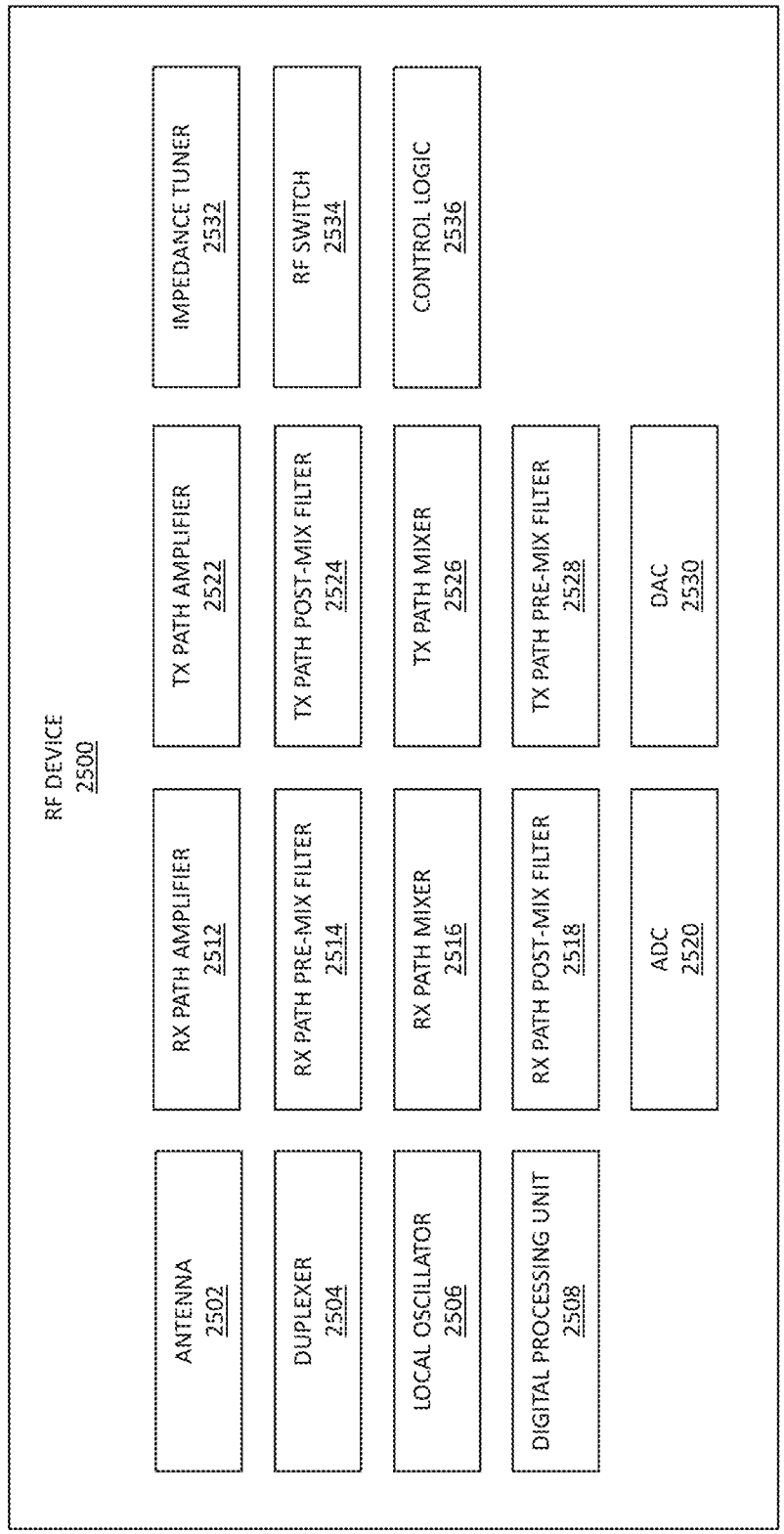
FIG. 9 is a block diagram of an example RF device that may include one or more IC structures having at least one cascode arrangement in accordance with one or more embodiments.

FIG. 9 is a block diagram of an example RF device 2500 that may include one or more components with one or more IC structures having at least one cascode arrangement in accordance with any of the embodiments disclosed herein. For example, any suitable ones of the components of the RF device 2500 may include a die (e.g., the die 2002 as described with reference to FIG. 5 or a die implementing any of the IC structures as described with reference to FIGS. 1-4) including at least one cascode arrangement in accordance with any of the embodiments disclosed herein. Any of the components of the RF device 2500 may include an IC device (e.g., any of the IC structures of FIGS. 1-4) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a millimeter-wave wireless technology such as fifth generation (5G) wireless (e.g., high-frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path that may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path that may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534, and control logic 2536. In various embodiments, the RF device 2500 may include multiple instances of any of the components shown in FIG. 9. In some embodiments, the RX path amplifier 2512, the TX path amplifier 2522, the duplexer 2504, and the RF switch 2534 may be considered to form, or be a part of, an RF FE of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 9) may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 9 as control logic 2536, e.g., an RF FE control interface. The control logic 2536 may be used to, e.g., enhance control of complex RF system environment, support implementation of envelope tracking techniques, reduce dissipated power, etc.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, e.g., non-overlapping and non-continuous, bands of frequencies, e.g., in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (e.g., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas. Any of the embodiments of the IC structures with at least one cascode arrangement as described herein may be used to implement at least a portion of the RF switch 2534.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having at least one cascode arrangement in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having at least one cascode arrangement in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502. Various IC structures as described herein may be particularly advantageous for realizing at least portions of the RX path amplifier 2512.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the TX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a bandpass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission. Any of the embodiments of the IC structures with at least one cascode arrangement may be used to implement the TX path amplifier 2522 as a PA.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as AlN, enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators that may be coupled to a switch, e. g., the RF switch 2534, configured to selectively switch any one of the plurality of RF resonators on and off (e.g., activate any one of the plurality of RF resonators), in order to achieve desired filtering characteristics of the filter bank (e.g., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g., antenna's impedance changes depending on, e.g., if the antenna is held in a hand, placed on a car roof, etc.

As described above, the RF switch 2534 may be a device configured to route high-frequency signals through transmission paths, e.g., in order to selectively switch between a plurality of instances of any one of the components shown in FIG. 9, e.g., to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500. In some embodiments, the RF switch 2534 may be implemented as a solid-state RF switch in the form of any embodiments of a III-N transistor as described herein. Typically, an RF system, or an RFIC, would include a plurality of such RF switches. Various IC structures as described herein may be particularly advantageous for realizing at least portions of such RF switches.

In various embodiments, III-N transistor-based cascode arrangements as described herein may be particularly advantageous when used in, or to provide an RF interconnect to (e.g., to provide means for supporting communication of RF signals to), any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534. In various embodiments, III-N transistor-based cascode arrangements as described herein may enable more energy efficient CMOS implementations of circuits, e.g., to name a few, control logic circuitries, current mirrors, power gating circuitries, memory elements etc.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable phased-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

SELECT EXAMPLES

The following paragraphs provide various examples of the embodiments disclosed herein.

Example 1 provides an IC structure that includes a source region, a drain region, an enhancement mode III-N transistor having a first S/D terminal and a second S/D terminal, and a depletion mode III-N transistor having a first S/D terminal and a second S/D terminal. The first S/D terminal of the enhancement mode III-N transistor is coupled to the source region, the second S/D terminal of the enhancement mode III-N transistor is coupled to the first S/D terminal of the depletion mode III-N transistor, and the second S/D terminal of the depletion mode III-N transistor is coupled to the drain region.

Example 2 provides the IC structure according to example 1, where the first S/D terminal of the enhancement mode III-N transistor is further coupled to a gate terminal of the depletion mode III-N transistor.

Example 3 provides the IC structure according to examples 1 or 2, where the source region, the drain region, the enhancement mode III-N transistor, and the depletion mode III-N transistor form a cascode device, and where the cascode device is to be switched on by applying a positive voltage to a gate terminal of the enhancement mode III-N transistor.

Example 4 provides the IC structure according to any one of the preceding examples, further including an intermediate node region, where the second S/D terminal of the enhancement mode III-N transistor is coupled to the first S/D terminal of the depletion mode III-N transistor by the second S/D terminal of the enhancement mode III-N transistor being coupled to the intermediate node region and the intermediate node region being coupled to the first S/D terminal of the depletion mode III-N transistor.

Example 5 provides the IC structure according to example 4, where, during operation, the intermediate node region is configured to be electrically floating (i.e., not electrically connected to anything).

Example 6 provides the IC structure according to examples 4 or 5, where the intermediate node region includes a doped semiconductor material with a dopant concentration of at least $10^{19}$ cm$^{-3}$, e.g., of at least $1\times10^{20}$ cm$^{-3}$ or of at least $1\times10^{21}$ cm$^{-3}$.

Example 7 provides the IC structure according to any one of the preceding examples, where the enhancement mode III-N transistor is a first enhancement mode III-N transistor, the IC structure further includes a second enhancement mode III-N transistor having a first S/D terminal and a second S/D terminal, and the first S/D terminal of the first enhancement mode III-N transistor is coupled to the source region by the first S/D terminal of the second enhancement mode III-N transistor being coupled to the source region and the second S/D terminal of the second enhancement mode III-N transistor being coupled to the first S/D terminal of the first enhancement mode III-N transistor.

Example 8 provides the IC structure according to any one of the preceding examples, where the depletion mode III-N transistor is a first depletion mode III-N transistor, the IC structure further includes a second depletion mode III-N transistor having a first S/D terminal and a second S/D terminal, and the first S/D terminal of the enhancement mode III-N transistor is coupled to the source region by the first S/D terminal of the second depletion mode III-N transistor being coupled to the source region and the second S/D terminal of the second depletion mode III-N transistor being coupled to the first S/D terminal of the enhancement mode III-N transistor.

Example 9 provides the IC structure according to any one of the preceding examples, where each of the enhancement mode III-N transistor and the depletion mode III-N transistor includes a MI-N channel stack including a III-N channel material and a polarization material, where a lattice constant of the polarization material is smaller than a lattice constant of the III-N channel material (e.g., at least 3% smaller, or at least 5% smaller, e.g., between about 5 and 10% smaller).

Example 10 provides the IC structure according to example 9, where a thickness of the polarization material between a gate of the enhancement mode III-N transistor and a support structure over which the enhancement mode III-N transistor and the depletion mode III-N transistor are formed is different from a thickness of the polarization material between a gate of the depletion mode III-N transistor and the support structure. In various embodiments, the difference may be between about 1 and 15 nanometers, including all values and ranges therein, e.g., between about 1 and 10 nanometers, or between about 2 and 5 nanometers.

Example 11 provides the IC structure according to examples 9 or 10, where the polarization material is between the III-N channel material and each of a gate of the enhancement mode III-N transistor and a gate of the depletion mode III-N transistor, the gate of the depletion mode III-N transistor interfaces (e.g., is in contact with) the polarization material, the IC structure includes a semiconductor material including dopant atoms with a dopant concentration of at least $1\times10^{19}$ cm$^{-3}$, e.g., of at least $1\times10^{20}$ cm$^{-3}$ or of at least $1\times10^{21}$ cm$^{-3}$, and the semiconductor material is between the gate of the enhancement mode III-N transistor and the polarization material.

Example 12 provides the IC structure according to example 11, where the dopant atoms are P-type dopant atoms.

Example 13 provides the IC structure according to examples 11 or 12, where the semiconductor material is a III-N semiconductor material.

Example 14 provides the IC structure according to any one of examples 11-13, where a thickness of the semiconductor material is between about 1 nanometer and 15 nanometers, including all values and ranges therein, e.g., between about 1 and 10 nanometers, or between about 1 and 3 nanometers.

Example 15 provides the IC structure according to any one of examples 9-14, further including a region with negative charges between a gate of the enhancement mode III-N transistor and the III-N channel material.

Example 16 provides the IC structure according to example 15, where a concentration of the negative charges in the region is at least about $1\times10^{19}$ cm$^{-3}$, e.g., at least $1\times10^{20}$ cm$^{-3}$ or at least $1\times10^{21}$ cm$^{-3}$.

Example 17 provides the IC structure according to examples 15 or 16, where the negative charges are in the polarization material.

Example 18 provides the IC structure according to any one of examples 9-17, further including a field plate structure of an electrically conductive material, the field plate structure coupled to a gate of the depletion mode III-N transistor and extending over at least a portion of the III-N channel stack towards the drain region.

Example 19 provides the IC structure according to any one of examples 9-18, further including a field plate structure of an electrically conductive material, the field plate structure coupled to the source region and extending over at least a portion of the III-N channel stack towards the depletion mode III-N transistor.

Example 20 provides the IC structure according to any one of examples 9-19, where a gate of the enhancement mode III-N transistor includes a gate electrode material and a gate dielectric, and a gate of the depletion mode III-N transistor includes a gate electrode material that interfaces the polarization material.

Example 21 provides an IC structure that includes a III-N channel stack including a III-N semiconductor material and a polarization material, where a lattice constant of the polarization material is smaller than a lattice constant of the III-N semiconductor material. The IC structure further includes a source region and a drain region; a first gate, adjacent to the III-N channel stack; and a second gate, adjacent to the III-N channel stack. In such an IC structure, the first gate is between the source region and the second gate, the second gate is between the first gate and the drain region, and the first gate is configured to enable conduction between the source region and the drain region when a positive voltage is applied to the first gate (i.e., the first gate is a gate of an enhancement mode III-N transistor). The second gate may be coupled to a ground potential during operation.

Example 22 provides the IC structure according to example 21, where each of the first gate and the second gate is provided in an individual recess in the polarization material.

Example 23 provides the IC structure according to examples 21 or 22, where a thickness of the polarization material between the first gate and the III-N channel material is different from a thickness of the polarization material between the second gate and the III-N channel material. In various embodiments, the difference may be between about 1 and 15 nanometers, including all values and ranges therein, e.g., between about 1 and 10 nanometers, or between about 2 and 5 nanometers.

Example 24 provides the IC structure according to any one of examples 21-23, further including one or more features of the IC structure according to any one of examples 1-20. For example, in one IC structure according to example 24, the first gate may be a gate of the enhancement mode III-N transistor according to any one of examples 1-20 and the second gate may be a gate of the depletion mode III-N transistor according to any one of examples 1-20.

Example 25 provides an IC structure that includes a III-N channel stack including a III-N semiconductor material and a polarization material, where a lattice constant of the polarization material is smaller than a lattice constant of the III-N semiconductor material. The IC structure further includes a source region and a drain region; a first gate; and a second gate. In such an IC structure, a first portion of the III-N channel stack is between the source region and the first gate, a second portion of the III-N channel stack is between the first gate and the second gate, and a third portion of the III-N channel stack is between the second gate and the drain region.

Example 26 provides the IC structure according to example 25, where the source region, the drain region, the first gate and the second gate are parts of a cascode device, and where the cascode device is configured to be switched on by applying a positive voltage to the first gate.

Further examples include the IC structure according to examples 25 or 26, further including one or more features of the IC structure according to any one of examples 1-24. For example, in one IC structure according to example 25, the first gate may be a gate of the enhancement mode III-N transistor according to any one of examples 1-20 and the second gate may be a gate of the depletion mode III-N transistor according to any one of examples 1-20.

Example 27 provides an IC package that includes an IC die, the IC die including the IC structure according to any one of the preceding examples (e.g., any one of examples 1-26), and a further IC component, coupled to the IC die.

Example 28 provides the IC package according to example 27, where the further IC component includes one of a package substrate, an interposer, or a further IC die.

Example 29 provides the IC package according to any one of examples 27-28, where the IC package is included in a base station of a wireless communication system.

Example 30 provides the IC package according to any one of examples 27-28, where the IC package is included in a UE device (e.g., a mobile device) of a wireless communication system.

Example 31 provides the IC package according to any one of the preceding examples, where the IC die is a part of an RF device.

Example 32 provides an electronic device that includes a carrier substrate and an IC die coupled to the carrier substrate. The IC die includes the IC structure according to any one of examples 1-26, and/or is included in the IC package according to any one of examples 27-31.

Example 33 provides the electronic device according to example 32, where the computing device is a wearable or handheld electronic device.

Example 34 provides the electronic device according to examples 32 or 33, where the electronic device further includes one or more communication chips and an antenna.

Example 35 provides the electronic device according to any one of examples 32-34, where the carrier substrate is a motherboard.

Example 36 provides the electronic device according to any one of examples 32-35, where the electronic device is an RF transceiver.

Example 37 provides the electronic device according to any one of examples 32-36, where the electronic device is one of an RF switch, a power amplifier, a low-noise amplifier, a filter, a filter bank, a duplexer, an upconverter, or a downconverter of an RF communications device, e.g., of an RF transceiver.

Example 38 provides the electronic device according to any one of examples 32-37, where the electronic device is included in a base station of a wireless communication system.

Example 39 provides the electronic device according to any one of examples 32-37, where the electronic device is included in a UE device (e.g., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
 a source region;
 a drain region;
 an enhancement mode III-N transistor having a first source or drain terminal (S/D terminal) and a second S/D terminal; and
 a depletion mode III-N transistor having a first S/D terminal and a second S/D terminal,
 wherein the first S/D terminal of the enhancement mode III-N transistor is coupled to the source region, the second S/D terminal of the enhancement mode III-N transistor is coupled to the first S/D terminal of the depletion mode III-N transistor, and the second S/D terminal of the depletion mode III-N transistor is coupled to the drain region.

2. The IC structure according to claim 1, wherein the first S/D terminal of the enhancement mode M-N transistor is further coupled to a gate terminal of the depletion mode III-N transistor.

3. The IC structure according to claim 1, wherein the source region, the drain region, the enhancement mode III-N transistor, and the depletion mode III-N transistor form a cascode device, and wherein the cascode device is to be switched on by applying a positive voltage to a gate terminal of the enhancement mode III-N transistor.

4. The IC structure according to claim 1, further comprising an intermediate node region, wherein the second S/D terminal of the enhancement mode III-N transistor is coupled to the first S/D terminal of the depletion mode III-N transistor by the second S/D terminal of the enhancement mode III-N transistor being coupled to the intermediate node region and the intermediate node region being coupled to the first S/D terminal of the depletion mode III-N transistor.

5. The IC structure according to claim 4, wherein, during operation, the intermediate node region is configured to be electrically floating.

6. The IC structure according to claim 4, wherein the intermediate node region includes a doped semiconductor material with a dopant concentration of at least $10^{19}$ dopant atoms per cubic centimeter.

7. The IC structure according to claim 1, wherein:
the enhancement mode III-N transistor is a first enhancement mode III-N transistor,
the IC structure further includes a second enhancement mode III-N transistor having a first S/D terminal and a second S/D terminal, and
the first S/D terminal of the first enhancement mode III-N transistor is coupled to the source region by the first S/D terminal of the second enhancement mode III-N transistor being coupled to the source region and the second S/D terminal of the second enhancement mode III-N transistor being coupled to the first S/D terminal of the first enhancement mode III-N transistor.

8. The IC structure according to claim 1, wherein:
the depletion mode III-N transistor is a first depletion mode III-N transistor,
the IC structure further includes a second depletion mode III-N transistor having a first S/D terminal and a second S/D terminal, and
the first S/D terminal of the enhancement mode III-N transistor is coupled to the source region by the first S/D terminal of the second depletion mode III-N transistor being coupled to the source region and the second S/D terminal of the second depletion mode III-N transistor being coupled to the first S/D terminal of the enhancement mode III-N transistor.

9. The IC structure according to claim 1, wherein each of the enhancement mode III-N transistor and the depletion mode III-N transistor includes a III-N channel stack comprising a III-N channel material and a polarization material, where a lattice constant of the polarization material is smaller than a lattice constant of the III-N channel material.

10. The IC structure according to claim 9, wherein a thickness of the polarization material between a gate of the enhancement mode III-N transistor and a support structure over which the enhancement mode III-N transistor and the depletion mode III-N transistor are formed is different from a thickness of the polarization material between a gate of the depletion mode III-N transistor and the support structure.

11. The IC structure according to claim 9, wherein:
the polarization material is between the III-N channel material and each of a gate of the enhancement mode III-N transistor and a gate of the depletion mode III-N transistor,
the gate of the depletion mode III-N transistor interfaces the polarization material,
the IC structure includes a semiconductor material comprising dopant atoms with a dopant concentration of at least $1\times10^{19}$ dopant atoms per cubic centimeter, and
the semiconductor material is between the gate of the enhancement mode III-N transistor and the polarization material.

12. The IC structure according to claim 11, wherein:
the dopant atoms are P-type dopant atoms,
the semiconductor material is a III-N semiconductor material, and
a thickness of the semiconductor material is between 1 nanometer and 15 nanometers.

13. The IC structure according to claim 9, further comprising a region with negative charges between a gate of the enhancement mode III-N transistor and the III-N channel material, wherein a concentration of the negative charges in the region is at least $1\times10^{19}$ charges per cubic centimeter.

14. The IC structure according to claim 13, wherein the negative charges are in the polarization material.

15. The IC structure according to claim 9, further comprising a field plate structure of an electrically conductive material, wherein the field plate structure:
is coupled to a gate of the depletion mode III-N transistor and extends over at least a portion of the III-N channel stack towards the drain region, or
is coupled to the source region and extends over at least a portion of the III-N channel stack towards the depletion mode III-N transistor.

16. The IC structure according to claim 9, wherein:
a gate of the enhancement mode III-N transistor includes a gate electrode material and a gate dielectric, and
a gate of the depletion mode III-N transistor includes a gate electrode material that interfaces the polarization material.

17. An integrated circuit (IC) structure, comprising:
a III-N channel stack comprising a III-N semiconductor material and a polarization material;
a source region and a drain region;
a first gate, adjacent to the III-N channel stack; and
a second gate, adjacent to the III-N channel stack,
wherein:
the first gate is between the source region and the second gate,
the second gate is between the first gate and the drain region, and
the first gate is configured to enable conduction between the source region and the drain region when a positive voltage is applied to the first gate.

18. The IC structure according to claim 17, wherein a thickness of the polarization material between the first gate and the III-N channel material is different from a thickness of the polarization material between the second gate and the III-N channel material.

19. An integrated circuit (IC) structure, comprising:
a III-N channel stack comprising a III-N semiconductor material and a polarization material;
a source region and a drain region;
a first gate; and
a second gate,
wherein:
a first portion of the III-N channel stack is between the source region and the first gate,
a second portion of the III-N channel stack is between the first gate and the second gate, and
a third portion of the III-N channel stack is between the second gate and the drain region.

20. The IC structure according to claim 19, wherein the source region, the drain region, the first gate and the second gate are parts of a cascode device, and wherein the cascode device is configured to be switched on by applying a positive voltage to the first gate.

* * * * *

UNITED STATES PATENT AND TRADEMARK OFFICE
CERTIFICATE OF CORRECTION

| | | |
|---|---|---|
| PATENT NO. | : 11,527,532 B2 | Page 1 of 1 |
| APPLICATION NO. | : 16/419240 | |
| DATED | : December 13, 2022 | |
| INVENTOR(S) | : Nidhi Nidhi et al. | |

It is certified that error appears in the above-identified patent and that said Letters Patent is hereby corrected as shown below:

In the Claims

In Column 38, Claim 2, Line 44, delete "M-N" and insert -- III-N --, therefor.

Signed and Sealed this
Fourteenth Day of February, 2023

*Katherine Kelly Vidal*

Katherine Kelly Vidal
*Director of the United States Patent and Trademark Office*